(12) United States Patent
Katagiri (10) Patent No.: US 11,548,074 B2
(45) Date of Patent: Jan. 10, 2023

(54) COATED CUTTING TOOL

(71) Applicant: TUNGALOY CORPORATION, Fukushima (JP)

(72) Inventor: Takao Katagiri, Iwaki (JP)

(73) Assignee: TUNGALOY CORPORATION, Fukushima (JP)

( * ) Notice: Subject to any disclaimer, the term of this patent is extended or adjusted under 35 U.S.C. 154(b) by 3 days.

(21) Appl. No.: 17/210,309

(22) Filed: Mar. 23, 2021

(65) Prior Publication Data

US 2021/0362245 A1 Nov. 25, 2021

(30) Foreign Application Priority Data

May 25, 2020 (JP) .............................. JP2020-090471

(51) Int. Cl.
| | |
|---|---|
| *B23B 27/14* | (2006.01) |
| *C23C 16/34* | (2006.01) |
| *C23C 16/36* | (2006.01) |
| *B23C 5/16* | (2006.01) |
| *C23C 28/00* | (2006.01) |
| *C23C 28/04* | (2006.01) |

(52) U.S. Cl.
CPC .............. *B23B 27/148* (2013.01); *B23C 5/16* (2013.01); *C23C 16/34* (2013.01); *C23C 16/36* (2013.01); *C23C 28/042* (2013.01); *C23C 28/42* (2013.01); *B23B 2224/24* (2013.01); *B23B 2224/32* (2013.01); *B23B 2228/105* (2013.01)

(58) Field of Classification Search
CPC ... B23B 27/14; B23B 27/148; B23B 2224/34; B23B 2224/36; B23B 2228/105; C23C 14/0641; C23C 14/0664
USPC ......................................... 428/697, 698, 699
See application file for complete search history.

(56) References Cited

U.S. PATENT DOCUMENTS

| | | | |
|---|---|---|---|
| 9,725,811 B2 | 8/2017 | Kikuchi | |
| 2019/0061014 A1* | 2/2019 | Nishizawa | .............. C04B 41/52 |

FOREIGN PATENT DOCUMENTS

| | | | |
|---|---|---|---|
| EP | 3447166 A1 | | 2/2019 |
| JP | 05-269606 | * | 10/1993 |
| JP | 2008-087150 | * | 4/2008 |
| JP | 2009-090417 | * | 4/2009 |
| JP | 2009-255282 | * | 11/2009 |
| JP | 5594575 B2 | | 9/2014 |

(Continued)

*Primary Examiner* — Archene A Turner
(74) *Attorney, Agent, or Firm* — Studebaker & Brackett PC (57) ABSTRACT

Provided is a coated cutting tool having improved wear resistance and fracture resistance and a prolonged tool life. The coated cutting tool includes a substrate and a coating layer formed on the substrate. The coating layer includes a first layer containing $Ti(C_{x1}N_{1-x1})$ and a second layer containing $(Ti_{1-y1}Al_{y1})N$, particles in the first layer have an average particle size of 5 nm or more and less than 100 nm, $1.0 \leq I(111)/I(200) \leq 20.0$ in the first layer, the first layer has an average thickness of 5 nm or more and 1.0 μm or less, $0.1 \leq I(111)/I(200) \leq 1.0$ in the second layer, particles in the second layer have an average particle size of more than 100 nm and 300 nm or less, and the second layer has an average thickness of 5 nm or more and 2.0 μm or less.

20 Claims, 1 Drawing Sheet

(56) References Cited

FOREIGN PATENT DOCUMENTS

JP 2016-155221 * 9/2016
WO 2014136755 A1 9/2014

* cited by examiner

COATED CUTTING TOOL

CROSS-REFERENCES TO RELATED APPLICATIONS

This application relates to and claims priority from Japanese Patent Application No. 2020-090471 on (May 25, 2020), the entire disclosure of which is incorporated herein by reference.

BACKGROUND OF THE INVENTION

Field of the Invention

The present invention relates to a coated cutting tool.

Description of Related Art

Conventionally, for the cutting processing of steel and the like, cutting tools made of cemented carbides or cubic boron nitride (cBN) sintered compacts have been widely used. Among them, a surface-coated cutting tool including at least one hard coating film, such as a TiN layer or a TiAlN layer, on the surface of a cemented carbide substrate is highly versatile and thus has been used for various kinds of processing.

For example, WO 2014/136755 proposes that when a layer represented by $(Al_aTi_bM_c)X$ [wherein M represents at least one element selected from the group consisting of Zr, Hf, V, Nb, Ta, Cr, Mo, W, Y, B, and Si, X represents at least one element selected from the group consisting of C, N, and O, a represents the atomic ratio of elemental Al to the total of elemental Al, elemental Ti, and elemental M, b represents the atomic ratio of elemental Ti to the total of elemental Al, elemental Ti, and elemental M, c represents the atomic ratio of elemental M to the total of elemental Al, elemental Ti, and elemental M, and a, b, and c satisfy $0.30 \leq a \leq 0.65$, $0.35 \leq b \leq 0.70$, $0 \leq c \leq 0.20$, and $a+b+c=1$] is present on a substrate, and the average particle size in the layer is greater than 200 nm, the resulting wear resistance is higher than before.

In addition, in Japanese Patent No. 5594575, with respect to a layer that satisfies $(Al_{1-x}Ti_x)N$ [$0.40 \leq X \leq 0.65$] on a substrate, characterized in that the layer has an alternating laminate structure formed of a thin layer A and a thin layer B having a granular structure and a columnar structure of the complex nitride of Al and Ti described above, respectively, and the average crystal grain size of granular crystals constituting the thin layer A is 30 nm or less, while the average particle size of columnar crystals constituting the thin layer B is 50 to 500 nm, it is proposed that a cutting tool having vapor-deposited thereon such a coating layer has better chipping resistance and wear resistance than before.

In the recent cutting processing of difficult-to-cut materials such as stainless steel, the speed and feed tend to increase, and the cutting conditions tend to be severer than before. With such tendencies, it has been demanded to further improve wear resistance and fracture resistance to extend the tool life. The coating film of WO 2014/136755 described above has, as a whole, a coating film particle size of greater than 200 nm and thus exerts excellent wear resistance, while it is expected that sudden fracture or chipping is likely to occur. In the coated cutting tool of Japanese Patent No. 5594575 described above, the layer A made of granular crystals and the layer B made of columnar crystals, which are the same in composition, are alternately stacked. Thus, the interface compatibility is high, strains are small, and the coating film hardness is insufficient. As a result, the wear resistance is insufficient, and thus it is difficult to prolong the tool life.

SUMMARY

The invention has been accomplished against the above background, and it is desirable to provide a coated cutting tool having improved wear resistance and fracture resistance and a prolonged tool life.

The present inventors have conducted studies on the extension of the tool life of a coated cutting tool. As a result, they have found that when a coated cutting tool has a specific configuration, its wear resistance and fracture resistance can be improved, and, consequently, the tool life of the coated cutting tool can be extended. The invention has thus been accomplished.

That is, the outline of the invention is as follows.

[1]

A coated cutting tool comprising a substrate and a coating layer formed on the substrate,
the coated cutting tool being configured such that
the coating layer includes a first layer containing a compound having a composition represented by the following formula (1) and a second layer containing a compound having a composition represented by the following formula (2):

$$Ti(C_{x1}N_{1-x1}) \quad (1)$$

(in formula (1), x1 represents the atomic ratio of elemental C to the total of elemental C and elemental N and satisfies $0.02 \leq x1 \leq 0.30$)

$$(Ti_{1-y1}Al_{y1})N \quad (2)$$

(in formula (2), y1 represents the atomic ratio of elemental Al to the total of elemental Ti and elemental Al and satisfies $0.25 \leq y1 \leq 0.75$), particles in the first layer have an average particle size of 5 nm or more and less than 100 nm, in the first layer, the ratio of the diffraction peak intensity I(111) of the (111) plane to the diffraction peak intensity I(200) of the (200) plane is $1.0 \leq I(111)/I(200) \leq 20.0$, the first layer has an average thickness of 5 nm or more and 1.0 μm or less, in the second layer, the ratio of the diffraction peak intensity I(111) of the (111) plane to the diffraction peak intensity I(200) of the (200) plane is $0.1 \leq I(111)/I(200) \leq 1.0$, particles in the second layer have an average particle size of more than 100 nm and 300 nm or less, and the second layer has an average thickness of 5 nm or more and 2.0 μm or less.

[2]

The coated cutting tool according to [1], wherein the compounds in the first layer and the second layer have an overall average composition represented by the following formula (3):

$$(Ti_{1-y2}Al_{y2})(C_{x2}N_{1-x2}) \quad (3)$$

(in formula (3), x2 represents the atomic ratio of elemental C to the total of elemental C and elemental N and satisfies $0.01 \leq x2 \leq 0.15$, and y2 represents the atomic ratio of elemental Al to the total of elemental Ti and elemental Al and satisfies $0.12 \leq y2 \leq 0.38$).

[3]

The coated cutting tool according to [1] or [2], wherein the first layer has a residual stress of −4.0 GPa or more and −2.0 GPa or less, and the second layer has a residual stress of −2.0 GPa or more and 0 GPa or less.

[4]

The coated cutting tool according to any one of [1] to [3], wherein the coating layer has an alternating laminate structure formed by alternately forming the first layer and the second layer repeatedly at least twice.

[5]

The coated cutting tool according to any one of [1] to [4], wherein in the X-ray diffraction of the first layer, the (111) plane shows the highest peak.

[6]

The coated cutting tool according to any one of [1] to [5], wherein in the X-ray diffraction of the second layer, the (200) plane shows the highest peak.

[7]

The coated cutting tool according to claim 2, wherein the difference ΔC (x1−x2) between the atomic ratio x2 of elemental C in the average composition represented by formula (3) and the atomic ratio x1 of elemental C in the composition represented by formula (1) is 0.01 or more and 0.15 or less.

[8]

The coated cutting tool according to claim 2, wherein the difference ΔAl (y1−y2) between the atomic ratio y2 of elemental Al in the average composition represented by formula (3) and the atomic ratio y1 of elemental Al in the composition represented by formula (2) is 0.12 or more and 0.38 or less.

[9]

The coated cutting tool according to any one of [1] to [8], wherein the coating layer has an overall average thickness of 2.0 μm or more and 10.0 μm or less.

[10]

The coated cutting tool according to any one of [1] to [9], wherein the substrate is a cemented carbide, a cermet, a ceramic, or a cubic boron nitride sintered compact.

Advantageous Effects of the Invention

According to the invention, a coated cutting tool having improved wear resistance and fracture resistance and a prolonged tool life can be provided.

BRIEF DESCRIPTION OF THE DRAWINGS

The FIGURE is a schematic view showing an example of a coated cutting tool of the invention.

DETAILED DESCRIPTION

Figure 1:
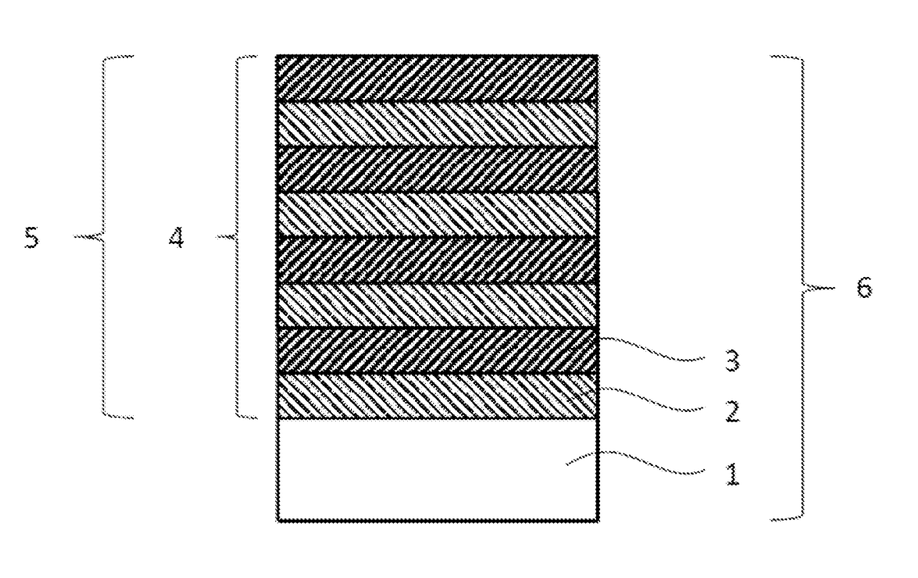

Hereinafter, a mode for carrying out the invention (hereinafter simply referred to as "this embodiment") will be described in detail. However, the invention is not limited to the embodiment described below. Various modifications can be made to the invention without deviating from the gist of the invention. Incidentally, in the drawing, the same elements are identified by the same reference numerals, and redundant explanations are omitted. In addition, unless otherwise noted, the positional relationships, such as up, down, right, and left, are based on the positional relationships shown in the drawing. Further, the dimensional ratio in the drawing is not limited to the illustrated ratio.

A coated cutting tool of this embodiment includes a substrate and a coating layer formed on the substrate.

The coating layer includes a first layer containing a compound having a composition represented by the following formula (1) and a second layer containing a compound having a composition represented by the following formula (2):

$$\mathrm{Ti}(C_{x1}N_{1-x1}) \quad (1)$$

(in formula (1), x1 represents the atomic ratio of elemental C to the total of elemental C and elemental N and satisfies 0.02≤x1≤0.30)

$$(\mathrm{Ti}_{1-y1}\mathrm{Al}_{y1})N \quad (2)$$

(in formula (2), y1 represents the atomic ratio of elemental Al to the total of elemental Ti and elemental Al and satisfies 0.25≤y1≤0.75), particles in the first layer have an average particle size of 5 nm or more and less than 100 nm, in the first layer, the ratio of the diffraction peak intensity I(111) of the (111) plane to the diffraction peak intensity I(200) of the (200) plane is 1.0≤I(111)/I(200)≤20.0, the first layer has an average thickness of 5 nm or more and 1.0 μm or less, in the second layer, the ratio of the diffraction peak intensity I(111) of the (111) plane to the diffraction peak intensity I(200) of the (200) plane is 0.1≤I(111)/I(200)≤1.0, particles in the second layer have an average particle size of more than 100 nm and 300 nm or less, and the second layer has an average thickness of 5 nm or more and 2.0 μm or less.

The factor that makes such a coated cutting tool have improved wear resistance and fracture resistance and a prolonged tool life is not specifically clear, but the present inventors see the factor as follows. However, the factor is not limited thereto. That is, in the first layer forming the coating layer, when x1 in the composition $\mathrm{Ti}(C_{x1}N_{1-x1})$ of the compound contained therein is 0.02 or more, the hardness improves, whereby the wear resistance of the coated cutting tool improves. In addition, as a result of grain refinement, compression stress is likely to be imparted, and the propagation of cracks is suppressed, whereby the fracture resistance improves. In addition, when x1 in $\mathrm{Ti}(C_{x1}N_{1-x1})$ is 0.3 or less, the adhesion to the second layer forming the coating layer is excellent, and thus fracture due to delamination resistance is suppressed. In addition, in the second layer forming the coating layer, when y1 in the composition $(\mathrm{Ti}_{1-y1}\mathrm{Al}_{y1})N$ of the compound contained therein is 0.25 or more, the heat resistance improves, and thus, even in processing at a high cutting temperature such as high-speed processing or high-load processing, reaction wear can be suppressed, whereby the wear resistance of the coated cutting tool improves. In addition, when y1 in $(\mathrm{Ti}_{1-y1}\mathrm{Al}_{y1})N$ is 0.75 or less, as the effect of containing Ti, the high-temperature strength is improved and the formation of hexagonal crystals is suppressed, whereby the wear resistance of the coated cutting tool improves. In addition, when the average particle size of particles in the first layer is 5 nm or more, the adhesion between the coating layer and the substrate improves, while when it is less than 100 nm, the compression stress increases, whereby the fracture resistance of the coated cutting tool improves. In addition, in the first layer, when the ratio of the diffraction peak intensity I(111) of the (111) plane to the diffraction peak intensity I(200) of the (200) plane I(111)/I(200) is 1.0 or more, this shows that the layer is more oriented in the cubic (111) plane. When the layer is more oriented in the cubic (111) plane, such a plane serves as the close-packed plane and thus is unlikely to be distorted. As a result, the hardness increases, whereby the wear resistance of the coated cutting tool improves. Meanwhile, when the I(111)/I(200) ratio is 20.0 or less, production is easy. In addition, when the average thickness of the first layer is 5 nm or more, the propagation of cracks generated during processing can be suppressed, whereby the fracture resistance improves, while when it is 1.0 μm or less, compression stress is likely to be imparted, and thus the propagation of cracks is suppressed, whereby the fracture resistance improves.

In addition, in the second layer, when the ratio of the diffraction peak intensity I(111) of the (111) plane to the diffraction peak intensity I(200) of the (200) plane I(111)/I(200) is 0.1 or more, production is easy. In addition, when I(111)/I(200) in the second layer is 1.0 or less, this shows that the layer is more oriented in the cubic (200) plane. When the layer is more oriented in the cubic (200) plane, the toughness increases, whereby the fracture resistance of the coated cutting tool improves. In addition, when the average particle size of particles in the second layer is more than 100 nm, chipping due to the shedding of particles is further suppressed, whereby the fracture resistance of the coated cutting tool improves. Meanwhile, when the average particle size of particles in the second layer is 300 nm or less, compression stress is imparted, whereby the fracture resistance of the coated cutting tool improves. In addition, when the average thickness of the second layer is 5 nm or more, the propagation of cracks generated during processing can be suppressed, whereby the fracture resistance improves, while when it is 2.0 μm or less, the adhesion to the first layer improves, and fracture due to delamination can be suppressed. Through these effects together, the coated cutting tool of the embodiment has improved wear resistance and fracture resistance and a prolonged tool life.

The coated cutting tool of this embodiment includes a substrate and a coating layer formed on the surface of the substrate. The substrate used in this embodiment is not particularly limited as long as it can be used as a substrate of a coated cutting tool. As examples of substrates, cemented carbides, cermets, ceramics, cubic boron nitride sintered compacts, diamond sintered compacts, and high-speed steels can be mentioned. Among them, when the substrate is at least one member selected from the group consisting of cemented carbides, cermets, ceramics, and cubic boron nitride sintered compacts, the coated cutting tool has still more excellent fracture resistance, and thus this is still more preferable.

In the coated cutting tool of this embodiment, the overall average thickness of the coating layer is preferably 2.0 μm or more and 10.0 μm or less. In the coated cutting tool of this embodiment, when the overall average thickness of the coating layer is 2.0 μm or more, the wear resistance tends to further improve. Meanwhile, in the coated cutting tool of this embodiment, when the overall average thickness of the coating layer is 10.0 μm or less, the fracture resistance tends to further improve. Therefore, the overall average thickness of the coating layer is preferably 2.0 μm or more and 10.0 μm or less. In particular, from the same point of view as above, the overall average thickness of the coating layer is more preferably 2.5 μm or more and 9.5 μm or less.

[First Layer]

In the coated cutting tool of this embodiment, the coating layer includes a first layer containing a compound having a composition represented by the following formula (1).

$$Ti(C_{x1}N_{1-x1}) \quad (1)$$

(In formula (1), x1 represents the atomic ratio of elemental C to the total of elemental C and elemental N and satisfies 0.02≤x1≤0.30.)

In the first layer forming the coating layer, when x1 in the composition $Ti(C_{x1}N_{1-x1})$ of the compound contained therein is 0.02 or more, the hardness improves, whereby the wear resistance of the coated cutting tool improves. In addition, as a result of grain refinement, compression stress is likely to be imparted, and the propagation of cracks is suppressed, whereby the fracture resistance improves. In addition, when x1 in $Ti(C_{x1}N_{1-x1})$ is 0.3 or less, the adhesion to the second layer forming the coating layer is excellent, and thus fracture due to delamination resistance is suppressed. From the same point of view, x1 in $Ti(C_{x1}N_{1-x1})$ is preferably 0.04 or more and 0.3 or less, and more preferably 0.15 or more and 0.3 or less.

In addition, in this embodiment, in the case where the composition of each compound layer is expressed as $Ti(C_{0.20}N_{0.80})$, this means that the atomic ratio of elemental C to the total of elemental C and elemental N is 0.20, and the atomic ratio of elemental N to the total of elemental C and elemental N is 0.80. That is, the meaning is that the amount of elemental C relative to the total of elemental C and elemental N is 20 at %, and the amount of elemental N relative to the total of elemental C and elemental N is 80 at %.

Further, in the coated cutting tool of this embodiment, the average thickness of the first layer (in the case of an alternating laminate structure, per layer) is 5 nm or more and 1.0 μm or less. When the average thickness of the first layer is 5 nm or more, the propagation of cracks generated during processing can be suppressed, whereby the fracture resistance improves, while when it is 1.0 μm or less, compression stress is likely to be imparted, and thus the propagation of cracks is suppressed, whereby the fracture resistance improves. From the same point of view, in the case where the first layer is a single layer, its average thickness is more preferably 300 nm or more and 1.0 μm or less, and still more preferably 500 nm or more and 1.0 μm or less, while in the case of an alternating laminate structure, that is, in the case where the first layer has multiple layers, the average per-layer thickness of the first layer is more preferably 20 nm or more and 500 nm or less, and still more preferably 50 nm or more and 300 nm or less.

In addition, in the coated cutting tool of this embodiment, the average particle size of particles in the first layer is 5 nm or more and less than 100 nm. When the average particle size of particles in the first layer is 5 nm or more, the adhesion between the coating layer and the substrate improves, while when it is less than 100 nm, the compression stress increases, whereby the fracture resistance of the coated cutting tool improves. From the same point of view, the average particle size of particles in the first layer is preferably 7 nm or more and 97 nm or less, and more preferably 10 nm or more and 95 nm or less.

In addition, in the coated cutting tool of this embodiment, in the first layer, the ratio of the diffraction peak intensity I(111) of the (111) plane to the diffraction peak intensity I(200) of the (200) plane is 1.0≤I(111)/I(200)≤20.0. When I(111)/I(200) in the first layer is 1.0 or more, this shows that the layer is more oriented in the cubic (111) plane. When the layer is more oriented in the cubic (111) plane, such a plane serves as the close-packed plane and thus is unlikely to be distorted. As a result, the hardness increases, whereby the wear resistance of the coated cutting tool improves. Meanwhile, when the I(111)/I(200) ratio is 20.0 or less, production is easy. From the same point of view, I(111)/I(200) in the first layer is preferably 1.1 or more and 19.5 or less, and more preferably 1.2 or more and 19.4 or less.

In addition, in the coated cutting tool of this embodiment, it is preferable that in the X-ray diffraction of the first layer, the (111) plane shows the highest peak. In the coated cutting tool of this embodiment, when the (111) plane shows the highest peak in the X-ray diffraction of the first layer, the hardness increases, whereby the wear resistance tends to improve.

In addition, in the coated cutting tool of this embodiment, it is preferable that the residual stress in the first layer is −4.0 GPa or more and −2.0 GPa or less. When the residual stress in the first layer is −4.0 GPa or more, it tends to be possible to suppress cracking in the coating layer after the coating layer formation, while when it is −2.0 GPa or less, because of the effect of having compression stress, the propagation of cracks can be suppressed, whereby the fracture resistance of the coated cutting tool tends to improve.

[Second Layer]

In the coated cutting tool of this embodiment, the coating layer includes a second layer containing a compound having a composition represented by the following formula (2).

$(Ti_{1-y1}Al_{y1})N$      (2)

(In formula (2), y1 represents the atomic ratio of elemental Al to the total of elemental Ti and elemental Al and satisfies 0.25≤y1≤0.75.)

In the second layer forming the coating layer, when y1 in the composition $(Ti_{1-y1}Al_{y1})N$ of the compound contained therein is 0.25 or more, the heat resistance improves, and thus, even in processing at a high cutting temperature such as high-speed processing or high-load processing, reaction wear can be suppressed, whereby the wear resistance of the coated cutting tool improves. In addition, when y1 in $(Ti_{1-y1}Al_{y1})N$ is 0.75 or less, as the effect of containing Ti, the high-temperature strength is improved and the formation of hexagonal crystals is suppressed, whereby the wear resistance of the coated cutting tool improves. From the same point of view, y1 in $(Ti_{1-y1}Al_{y1})N$ is preferably 0.26 or more and 0.75 or less, and more preferably 0.27 or more and 0.74 or less.

In addition, in the coated cutting tool of this embodiment, in the case where the below-mentioned lower layer is not formed, it is preferable that the second layer is first formed on the surface of the substrate. In the coated cutting tool of this embodiment, when the second layer is first formed on the surface of the substrate, the adhesion between the substrate and the coating layer tends to improve.

Further, in the coated cutting tool of this embodiment, the average thickness of the second layer (in the case of an alternating laminate structure, per layer) is 5 nm or more and 2.0 μm or less. When the average thickness of the second layer is 5 nm or more, the propagation of cracks generated during processing can be suppressed, whereby the fracture resistance improves, while when it is 2.0 μm or less, the adhesion to the first layer improves, and fracture due to delamination can be suppressed. From the same point of view, in the case where the second layer is a single layer, its average thickness is more preferably 1.0 μm or more and 2.0 μm or less, and still more preferably 1.5 μm or more and 2.0 μm or less, while in the case of an alternating laminate structure, that is, in the case where the second layer has multiple layers, the average per-layer thickness of the second layer is more preferably 20 nm or more and 500 nm or less, and still more preferably 50 nm or more and 300 nm or less.

In addition, in the coated cutting tool of this embodiment, in the second layer, the ratio of the diffraction peak intensity I(111) of the (111) plane to the diffraction peak intensity I(200) of the (200) plane is 0.1≤I(111)/I(200)≤1.0. In the second layer, when the ratio of the diffraction peak intensity I(111) of the (111) plane to the diffraction peak intensity I(200) of the (200) plane I(111)/I(200) is 1.0 or more, production is easy. In addition, when I(111)/I(200) in the second layer is 1.0 or less, this shows that the layer is more oriented in the cubic (200) plane. When the layer is more oriented in the cubic (200) plane, the toughness increases, whereby the fracture resistance of the coated cutting tool improves. From the same point of view, I(111)/I(200) in the second layer is preferably 0.1 or more and 0.9 or less.

In addition, in the coated cutting tool of this embodiment, it is preferable that in the X-ray diffraction of the second layer, the (200) plane shows the highest peak. In the coated cutting tool of this embodiment, when the (200) plane shows the highest peak in the X-ray diffraction of the second layer, the toughness increases, whereby the fracture resistance tends to improve.

The peak intensity of each crystal plane of the first layer and the second layer can be measured using a commercially available X-ray diffractometer. For example, using an X-ray diffractometer Model: RINT TTRIII manufactured by Rigaku Corporation, the peak intensity of each crystal plane can be measured by X-ray diffraction measurement of the 2θ/θ focusing optical system with Cu-Kα radiation under the following conditions: output: 50 kV, 250 mA, incident-side Soller slit: 5°, divergence longitudinal slit: 2/3°, divergence longitudinal limiting slit: 5 mm, scattering slit: 2/3°, receiving-side Soller slit: 5°, receiving slit: 0.3 mm, BENT monochromator, receiving monochrome slit: 0.8 mm, sampling width: 0.01°, scanning speed: 4°/min, 2θ measurement range: 20 to 50°. In the determination of the peak intensity of each crystal plane from the X-ray diffraction pattern, analysis software attached to the X-ray diffractometer may be used. In the analysis software, background processing and $K\alpha_2$ peak removal are performed using a cubic spline, and profile fitting is performed using a Pearson-VII function, whereby each peak intensity can be determined. Incidentally, also in the case of an alternating laminate structure, the peak intensity of each crystal plane can be measured under the same conditions. For example, it is possible that measurement is performed on arbitrary multiple layers of the first layer and the second layer, and the intensity ratio is calculated from the obtained peak intensity of each crystal plane.

In addition, in the coated cutting tool of this embodiment, it is preferable that the residual stress in the second layer is −2.0 GPa or more and 0 GPa or less. When the residual stress in the second layer is −2.0 GPa or more, because of the effect of having compression stress, cracking in the coating layer after the coating layer formation can be suppressed, and thus the adhesion between the coating layer and the substrate tends to improve. Meanwhile, when the residual stress in the second layer is 0 GPa or less, because of the effect of having compression stress, the propagation of cracks can be suppressed, whereby the fracture resistance of the coated cutting tool tends to improve. From the same point of view, the residual stress in the second layer is more preferably −2.0 GPa or more and −0.1 GPa or less, and still more preferably −2.0 GPa or more and −0.2 GPa or less.

The residual stress is an internal stress remaining within the coating layer (inherent strain). Generally, a stress represented by a numerical value with "−" (minus) is called "compression stress", while a stress represented by a numerical value with "+" (plus) is called "tensile stress". In this embodiment, in the expression of the magnitude of a residual stress, a greater numerical value with "+" (plus) is expressed as a higher residual stress, while a greater numerical value with "−" (minus) is expressed as a lower residual stress.

Incidentally, the residual stress can be measured by a sinew method using an X-ray diffractometer. Then, such a residual stress can be measured by measuring the stresses in arbitrary three points contained in a site involved in cutting (it is preferable that these points are selected to be 0.5 mm or more away from each other so that the stress at the site can be represented) by the above sinew method and determining the average. Incidentally, also in the case of an alternating laminate structure, the residual stress can be measured under the same conditions. For example, it is possible that measurement is performed on arbitrary multiple layers of the second layer, and the average is determined to calculate the residual stress.

In addition, in the coated cutting tool of this embodiment, the average particle size of particles in the second layer is more than 100 nm and 300 nm or less. When the average particle size of particles in the second layer is more than 100 nm, chipping due to the shedding of particles is further suppressed, whereby the fracture resistance of the coated cutting tool improves. Meanwhile, when the average particle size of particles in the second layer is 300 nm or less, compression stress is imparted, whereby the fracture resistance of the coated cutting tool improves. From the same point of view, the average particle size of particles in the second layer is preferably 103 nm or more and 298 nm or less, and more preferably 105 nm or more and 296 nm or less.

Incidentally, in this embodiment, the average particle size of particles in each layer of the coating layer can be measured, defining the direction parallel to the surface of the substrate as the particle size, by the method described below in the Examples.

[Alternating Laminate Structure]

In the coated cutting tool of this embodiment, it is preferable that the coating layer has an alternating laminate structure formed by alternately forming the first layer and the second layer repeatedly at least twice. In the coated cutting tool of this embodiment, when the coating layer has an alternating laminate structure formed by alternately forming the first layer and the second layer repeatedly at least twice, an increase in the compression stress can be suppressed, and thus a TiCN layer can be repeatedly formed to increase the total thickness of the coating layer. As a result, it tends to be possible to improve the wear resistance without a decrease in the fracture resistance. In addition, in the coated cutting tool of this embodiment, in the case where the below-mentioned lower layer is not formed, it is preferable that the second layer is first formed on the surface of the substrate. In the coated cutting tool of this embodiment, when the second layer is first formed on the surface of the substrate, the adhesion between the substrate and the coating layer tends to improve.

In the coated cutting tool of this embodiment, in the alternating laminate structure, the number of repeats for the first layer and the second layer is preferably 2 or more and 100 or less, more preferably 3 or more and 70 or less, still more preferably 5 or more and 50 or less, and particularly preferably 6 or more and 47 or less.

Incidentally, in this embodiment, in the case where one layer is formed for each of the first layer and the second layer, the "number of repeats" is 1.

In addition, in the coated cutting tool of this embodiment, it is preferable that the compounds in the first layer and the second layer have an overall average composition represented by the following formula (3).

$$(Ti_{1-y2}Al_{y2})(C_{x2}N_{1-x2}) \quad (3)$$

(In formula (3), x2 represents the atomic ratio of elemental C to the total of elemental C and elemental N and satisfies $0.01 \leq x2 \leq 0.15$, and y2 represents the atomic ratio of elemental Al to the total of elemental Ti and elemental Al and satisfies $0.12 \leq y2 \leq 0.38$.)

In the coated cutting tool of this embodiment, in the case where the coating layer has the above alternating laminate structure, the configuration is such that the amount of Al and the amount of C periodically change. Because of such a configuration, even when the atomic ratio of C in TiCN increases, an increase in the compression stress can be suppressed, resulting in excellent adhesion between the coating layer and the substrate. Accordingly, the coating layer can be thickened. In the case where the coating layer is thickened, the wear resistance of the coated cutting tool of this embodiment can be further improved, and the adhesion between the coating layer and the substrate also improves. As a result, it tends to be possible to suppress fracture due to delamination resistance.

When x2 in the overall average composition $(Ti_{1-y2}Al_{y2})(C_{x2}N_{1-x2})$ of the compounds in the first layer and the second layer is 0.01 or more, the hardness improves, whereby the wear resistance of the coated cutting tool improves. In addition, compression stress is likely to be imparted, and the propagation of cracks is suppressed, whereby the fracture resistance tends to improve. When x2 is 0.15 or less, the adhesion between the first layer and the second layer is excellent, and thus fracture due to delamination resistance tends to be suppressed. From the same point of view, x2 in the average composition $(Ti_{1-y2}Al_{y2})(C_{x2}N_{1-x2})$ is preferably 0.02 or more and 0.15 or less.

When y2 in the overall average composition $(Ti_{1-y2}Al_{y2})(C_{x2}N_{1-x2})$ of the compounds in the first layer and the second layer is 0.12 or more, the heat resistance improves, and thus, even in processing at a high cutting temperature such as high-speed processing or high-load processing, reaction wear can be suppressed, and, consequently, the wear resistance of the coated cutting tool tends to improve, while when x2 is 0.38 or less, as the effect of containing Ti, the high-temperature strength is improved and the formation of hexagonal crystals is suppressed, and, consequently, the wear resistance of the coated cutting tool tends to improve. From the same point of view, y2 in the average composition $(Ti_{1-y2}Al_{y2})(C_{x2}N_{1-x2})$ is preferably 0.14 or more and 0.37 or less.

In addition, in the coated cutting tool of this embodiment, it is preferable that the difference ΔC (x1−x2) between the atomic ratio x2 of elemental C in the average composition represented by formula (3) and the atomic ratio x1 of elemental C in the composition represented by formula (1) is 0.01 or more and 0.15 or less. In the coated cutting tool of this embodiment, when ΔC is 0.01 or more, grains in the coating layer are refined, compression stress is likely to be imparted, and the propagation of cracks is suppressed, whereby the fracture resistance tends to improve. Meanwhile, in the coated cutting tool of this embodiment, when ΔC is 0.15 or less, the adhesion between the coating layer and the substrate is excellent, and thus fracture due to delamination resistance tends to be suppressed.

In addition, in the coated cutting tool of this embodiment, it is preferable that the difference ΔAl (y1−y2) between the atomic ratio y2 of elemental Al in the average composition represented by formula (3) and the atomic ratio y1 of elemental Al in the composition represented by formula (2) is 0.12 or more and 0.38 or less. In the coated cutting tool of this embodiment, when ΔAl is 0.12 or more, interfacial strains are introduced, and the hardness improves, whereby the wear resistance tends to improve. Meanwhile, in the coated cutting tool of this embodiment, when ΔAl is 0.38 or less, the adhesion at the interface improves, and the delamination resistance improves, whereby the fracture resistance tends to improve.

The FIGURE is a schematic cross-sectional view showing an example of the coated cutting tool of this embodiment. A coated cutting tool 6 include a substrate 1 and a coating layer 5 formed on the surface of the substrate 1. The coating layer 5 has an alternating laminate structure 4 formed by alternately forming a first layer 2 and a second layer 3 in this order from the substrate 1 side repeatedly four times.

[Lower Layer]

The coating layer used in this embodiment may be comprised only of the first layer and the second layer, but preferably includes a lower layer between the substrate and a laminate structure of the first layer and the second layer (in the case of an alternating laminate structure, between the substrate and the alternating laminate structure of the first layer and the second layer). As a result, the adhesion between the substrate and the coating layer further improves. In particular, from the same point of view as above, the lower layer preferably contains a compound composed of at least one element selected from the group consisting of Ti, Zr, Hf, V, Nb, Ta, Cr, Mo, W, Al, Si, and Y and at least one element selected from the group consisting of C, N, O, and B, more preferably contains a compound composed of at least one element selected from the group consisting of Ti, V, Nb, Ta, Cr, Mo, W, Al, Si, and Y and at least one element selected from the group consisting of C, N, O, and B, and still more preferably contains a compound composed of at least one element selected from the group consisting of Ti, Ta, Cr, W, Al, Si, and Y and N. In addition, the lower layer may be single-layered or multi-layered including two or more layers.

In this embodiment, when the average thickness of the lower layer is 0.1 μm or more and 3.5 μm or less, the adhesion between the substrate and the coating layer tends to further improve, and thus this is preferable. From the same point of view, the average thickness of the lower layer is more preferably 0.2 μm or more and 3.0 μm or less, and still more preferably 0.3 μm or more and 2.5 μm or less.

[Upper Layer]

The coating layer used in this embodiment may include an upper layer on a side of the laminate structure of the first layer and the second layer opposite to the substrate (in the case of an alternating laminate structure, on a side of the alternating laminate structure of the first layer and the second layer opposite to the substrate). When the upper layer contains a compound composed of at least one element selected from the group consisting of Ti, Zr, Hf, V, Nb, Ta, Cr, Mo, W, Al, Si, and Y and at least one element selected from the group consisting of C, N, O, and B, the wear resistance is further excellent, and thus this is still more preferable. In addition, from the same point of view as the above, the upper layer more preferably contains a compound composed of at least one element selected from the group consisting of Ti, V, Nb, Ta, Cr, Mo, W, Al, Si, and Y and at least one element selected from the group consisting of C, N, O, and B, and still more preferably contains a compound composed of at least one element selected from the group consisting of Ti, Nb, Ta, Cr, W, Al, Si, and Y and N. In addition, the upper layer may be single-layered or multi-layered including two or more layers.

In this embodiment, when the average thickness of the upper layer is 0.1 μm or more and 3.5 μm or less, the wear resistance tends to further improve, and thus this is preferable. From the same point of view, the average thickness of the upper layer is more preferably 0.2 μm or more and 3.0 μm or less, and still more preferably 0.3 μm or more and 2.5 μm or less.

[Method for Producing Coating Layer]

The method for producing a coating layer in the coated cutting tool of this embodiment is not particularly limited. For example, physical vapor deposition methods such as ion plating, arc ion plating, sputtering, and ion mixing can be mentioned. When a coating layer is formed using a physical vapor deposition method, a sharp edge can be formed, and thus this is preferable. Among them, arc ion plating results in even more excellent adhesion between the coating layer and the substrate and thus is more preferable.

[Method for Producing Coated Cutting Tool]

Hereinafter, a method for producing the coated cutting tool of this embodiment will be described using specific examples. Incidentally, the method for producing the coated cutting tool of this embodiment is not particularly limited as long as the configuration of the coated cutting tool can be achieved.

First, a substrate processed into a tool shape is accommodated in the reaction vessel of a physical vapor deposition apparatus, and a metal evaporation source is placed in the reaction vessel. Subsequently, the inside of the reaction vessel is evacuated until the pressure reaches a vacuum of $1.0 \times 10^{-2}$ Pa or less, and, using a heater in the reaction vessel, the substrate is heated until its temperature reaches 200 to 700° C. After heating, Ar gas is introduced into the reaction vessel to make the pressure in the reaction vessel 0.5 Pa to 5.0 Pa. In an Ar gas atmosphere having a pressure of 0.5 Pa to 5.0 Pa, a bias voltage of −500 V to −350 V is applied to the substrate, and a current of 40 A to 50 A is passed through the tungsten filament in the reaction vessel to subject the surface of the substrate to an ion bombardment treatment with Ar gas. After the ion bombardment treatment of the surface of the substrate, the inside of the reaction vessel is evacuated until the pressure reaches a vacuum of $1.0 \times 10^{-2}$ Pa or less.

In the case where the lower layer used in this embodiment is formed, the substrate is heated until its temperature reaches 400° C. to 600° C. After heating, a gas is introduced into the reaction vessel to make the pressure in the reaction vessel 0.5 Pa to 5.0 Pa. As the gas, for example, $N_2$ gas can be mentioned in the case where the lower layer is made of a compound composed of at least one element selected from the group consisting of Ti, Zr, Hf, V, Nb, Ta, Cr, Mo, W, Al, Si, and Y and N, and a mixed gas of $N_2$ gas and $C_2H_2$ gas can be mentioned in the case where the lower layer is made of a compound composed of at least one element selected from the group consisting of Ti, Zr, Hf, V, Nb, Ta, Cr, Mo, W, Al, Si, and Y, N, and C. The volume ratio of the mixed gas is not particularly limited, and may be $N_2$ gas:$C_2H_2$ gas=95:5 to 85:15, for example. Next, a bias voltage of −80 V to −40 V is applied to the substrate, and, through arc discharge at an arc current of 100 A to 200 A, the metal evaporation source corresponding to the metal component of each layer is evaporated, whereby a lower layer can be formed.

In the case of forming the first layer used in this embodiment, the substrate is controlled so that its temperature is 350° C. to 550° C., and a nitrogen gas ($N_2$) is introduced into the reaction vessel to make the pressure in the reaction vessel 1.0 Pa to 5.0 Pa. Subsequently, a bias voltage of −80 V to −35 V is applied to the substrate, and, through arc discharge at 80 A to 150 A, a TiC evaporation source for the first layer is evaporated, whereby a first layer can be formed.

In the case of forming the second layer used in this embodiment, the substrate is controlled so that its temperature is 350° C. to 550° C. Incidentally, when the temperature of the substrate is the same as the temperature of the substrate at the time of forming the first layer, the first layer and the second layer can be continuously formed, and thus this is preferable. After controlling the temperature, $N_2$ gas is introduced into the reaction vessel to make the pressure in the reaction vessel 2.0 Pa to 4.0 Pa. Next, a bias voltage of −100 V to −40 V is applied to the substrate, and, through arc discharge at an arc current of 80 A to 150 A, the metal evaporation source corresponding to the metal component of the second layer is evaporated, whereby a second layer can be formed.

The alternating laminate structure of the first layer and the second layer can be formed by alternately forming each layer by alternately evaporating a TiC evaporation source and a metal evaporation source through arc discharge under the above conditions. By adjusting the arc discharge times for the TiC evaporation source and the metal evaporation source, respectively, the thickness of each layer constituting the alternating laminate structure can be controlled. Use of a TiC evaporation source makes it possible to easily form an alternating laminate structure having a per-layer thickness of 100 nm or less and thus is preferable.

In the formation of the first layer, when the pressure in the reaction vessel is increased, the proportion of elemental N in the composition represented by formula (1) decreases, and the proportion of elemental C (x1) can be increased.

In order to set the diffraction peak intensity ratio I(111)/I(200) in the first layer used in this embodiment at a predetermined value, the temperature of the substrate can be adjusted or the bias voltage can be adjusted in the course of forming the first layer described above. More specifically, in the course of forming the first layer, when the temperature of the substrate is reduced, or the negative bias voltage is increased (away from zero), I(111) in the first layer tends to increase.

In order to set the diffraction peak intensity ratio I(111)/I(200) in the second layer used in this embodiment at a predetermined value, the temperature of the substrate can be adjusted or the bias voltage can be adjusted in the course of forming the second layer described above. More specifically, in the course of forming the second layer, when the temperature of the substrate is reduced, or the negative bias voltage is increased (away from zero), I(111) in the second layer tends to increase.

In order to set the average particle size of particles in the first layer used in this embodiment at a predetermined value, the bias voltage or the amount of raw material for elemental C can be adjusted in the course of forming the first layer described above. More specifically, in the course of forming the first layer, when the negative bias voltage is increased (away from zero), the average particle size of particles in the first layer tends to decrease. In the course of forming the first layer, when the amount of raw material for elemental C is increased, the average particle size of particles in the first layer tends to decrease.

In order to set the average particle size of particles in the second layer used in this embodiment at a predetermined value, the bias voltage can be adjusted in the course of forming the second layer described above. More specifically, in the course of forming the second layer, when the negative bias voltage is increased (away from zero), the average particle size of particles in the second layer tends to decrease. As a result of the decrease in the average particle size of particles in the second layer, the aspect ratio increases. In addition, in the case of an alternating laminate structure, when the average per-layer thickness of the second layer is extremely small, the average particle size in particles in the second layer tends to decrease.

In the first layer used in this embodiment, in order to set the residual stress at a predetermined value, the bias voltage can be adjusted in the course of forming the first layer described above. More specifically, in the course of forming the first layer, when the negative bias voltage is increased (away from zero), the residual stress in the first layer tends to decrease. In addition, in the case of an alternating laminate structure, when the average per-layer thickness of the first layer increases, the residual stress in the first layer tends to decrease.

In the second layer used in this embodiment, in order to set the residual stress at a predetermined value, the bias voltage can be adjusted in the course of forming the second layer described above. More specifically, in the course of forming the second layer, when the negative bias voltage is increased (away from zero), the residual stress in the second layer tends to decrease.

In the case where the upper layer used in this embodiment is formed, it can be formed under the same production conditions as for the lower layer described above. That is, first, the substrate is heated until its temperature reaches 400° C. to 600° C. After heating, a gas is introduced into the reaction vessel to make the pressure in the reaction vessel 0.5 Pa to 5.0 Pa. As the gas, for example, $N_2$ gas can be mentioned in the case where the upper layer is made of a compound composed of at least one element selected from the group consisting of Ti, Zr, Hf, V, Nb, Ta, Cr, Mo, W, Al, Si, and Y and N, and a mixed gas of $N_2$ gas and $C_2H_2$ gas can be mentioned in the case where the upper layer is made of a compound composed of at least one element selected from the group consisting of Ti, Zr, Hf, V, Nb, Ta, Cr, Mo, W, Al, Si, and Y, N, and C. The volume ratio of the mixed gas is not particularly limited, and may be $N_2$ gas:$C_2H_2$ gas=95:5 to 85:15, for example. Next, a bias voltage of −80 V to −40 V is applied to the substrate, and, through arc discharge at an arc current of 100 A to 200 A, the metal evaporation source corresponding to the metal component of each layer is evaporated, whereby an upper layer can be formed.

The thickness of each layer constituting the coating layer in the coated cutting tool of this embodiment can be measured from the cross-sectional structure of the coated cutting tool using an optical microscope, a scanning electron microscope (SEM), a transmission electron microscope (TEM), or the like. Incidentally, the average thickness of each layer in the coated cutting tool of this embodiment can be determined by measuring the thicknesses of each layer from its cross-sections in three or more points near a position 50 μm from the cutting edge line part of the surface facing the metal evaporation source toward the center of such a surface, and calculating the average (arithmetic mean).

In addition, the composition of each layer constituting the coating layer in the coated cutting tool of this embodiment can be measured from the cross-sectional structure of the coated cutting tool of this embodiment using an energy dispersive X-ray analyzer (EDS), a wavelength dispersive X-ray analyzer (WDS), or the like.

In addition, the overall average composition of the compound layers in the first layer and the second layer can be determined using SEM or TEM attached to commercially available EDS. Specifically, for example, a cross-section of the coating layer (same as in the measurement of the thickness of the coating layer) is prepared, and the laminate structure or the alternating laminate structure of the first layer and the second layer is subjected to sectional analysis. At this time, the measurement range should be "a length that is 90% of the thickness of the laminate structure or the alternating laminate structure of the first layer and the second layer"דד"1 μm (length in the direction parallel to the substrate surface) or more". From the results of the sectional analysis, the atomic ratios in the overall average composition $(Ti_{1-y2}Al_{y2})(C_{x2}N_{1-x2})$ of the compound layers in the first layer and the second layer can each be determined.

The coated cutting tool of this embodiment is excellent in at least wear resistance and fracture resistance, and as a result, presumably, the effect that the tool life can be made longer than before is caused (however, the factor that enables the extension of the tool life is not limited to the above). As specific types of coated cutting tools in this embodiment, replaceable cutting inserts for milling or turning, drills, end mills, and the like can be mentioned.

EXAMPLES

Hereinafter, the invention will be described in further detail through examples. However, the invention is not limited to these examples.

Example 1

As a substrate, an insert of CNMG120408-SM (cemented carbide having a composition 89.6WC-9.800-0.6Cr$_3$O$_2$ (all mass %)) was prepared. In the reaction vessel of an arc ion plating apparatus, a TiC evaporation source and a metal evaporation source were disposed to make the composition of each layer shown in Table 1 and Table 2. The prepared substrate was fixed to the fixing bracket of the turntable in the reaction vessel.

Subsequently, the inside of the reaction vessel was evacuated until the pressure reached a vacuum of $5.0 \times 10^{-3}$ Pa or less. After evacuation, using a heater in the reaction vessel, the substrate was heated until its temperature reached 450° C. After heating, Ar gas was introduced into the reaction vessel to make the pressure 2.7 Pa.

In an Ar gas atmosphere having a pressure of 2.7 Pa, a bias voltage of −400 V was applied to the substrate, and a current of 40 A was passed through the tungsten filament in the reaction vessel to subject the surface of the substrate to an ion bombardment treatment with Ar gas for 30 minutes. After the completion of the ion bombardment treatment, the inside of the reaction vessel was evacuated until the pressure reached a vacuum of $5.0 \times 10^{-3}$ Pa or less.

With respect to inventive products 1 to 14, after evacuation, the substrate was controlled so that its temperature was the temperature shown in Table 3 (temperature at the start of film formation), then a nitrogen gas (N$_2$) was introduced into the reaction vessel, and the pressure inside the reaction vessel was adjusted to the pressure shown in Table 3. Subsequently, the bias voltage shown in Table 3 was applied to the substrate, and the TiC evaporation source for a first layer having the composition shown in Table 1 and the metal evaporation source for a second layer having the composition shown in Table 1 were evaporated through arc discharge at the arc current shown in Table 3 in such an order that the undermost layer shown in Table 1 was first formed on the surface of the substrate, thereby forming a first layer and a second layer in such an order that the undermost layer shown in Table 1 served as the first surface of the substrate. At this time, the pressure inside the reaction vessel was controlled to be the pressure shown in Table 3. In addition, the thickness of the first layer and the thickness of the second layer were controlled to be the thicknesses shown in Table 1 by adjusting each arc discharge time.

With respect to comparative products 1 to 11, after evacuation, the substrate was controlled so that its temperature was the temperature shown in Table 4 (temperature at the start of film formation), then a nitrogen gas (N$_2$) was introduced into the reaction vessel, and the pressure inside the reaction vessel was adjusted to the pressure shown in Table 4. Subsequently, the bias voltage shown in Table 4 was applied to the substrate, and the TiC evaporation source for a layer A having the composition shown in Table 2 and the metal evaporation source for a layer B having the composition shown in Table 2 were evaporated through arc discharge at the arc current shown in Table 4 in such an order that the undermost layer shown in Table 2 was first formed on the surface of the substrate, thereby forming a layer A and a layer B in such an order that the undermost layer shown in Table 2 served as the first surface of the substrate. At this time, the pressure inside the reaction vessel was controlled to be the pressure shown in Table 4. In addition, the thickness of the layer A and the thickness of the layer B were controlled to be the thicknesses shown in Table 2 by adjusting each arc discharge time.

After each layer was formed on the surface of the substrate to the predetermined average thickness shown in Table 1 or Table 2, the heater was turned off. After the sample temperature became 100° C. or less, the sample was removed from the inside of the reaction vessel.

TABLE 1

| | | Coating Layer | | | | |
| --- | --- | --- | --- | --- | --- | --- |
| | | First Layer: Ti(C$_{x1}$N$_{1-x1}$) | | Second Layer: (Ti$_{1-y1}$Al$_{y1}$)N | | Total |
| | Undermost Layer | Elemental C Atomic Ratio x1 | Average Thickness (nm) | Elemental Al Atomic Ratio y1 | Average Thickness (nm) | Thickness (μm) |
| Inventive Product 1 | Second Layer | 0.04 | 1000 | 0.50 | 1500 | 2.5 |
| Inventive Product 2 | Second Layer | 0.30 | 1000 | 0.50 | 1500 | 2.5 |
| Inventive Product 3 | Second Layer | 0.20 | 1000 | 0.50 | 1500 | 2.5 |
| Inventive Product 4 | Second Layer | 0.20 | 1000 | 0.27 | 1500 | 2.5 |
| Inventive Product 5 | Second Layer | 0.20 | 1000 | 0.74 | 1500 | 2.5 |
| Inventive Product 6 | First Layer | 0.20 | 500 | 0.50 | 2000 | 2.5 |
| Inventive Product 7 | Second Layer | 0.20 | 1000 | 0.50 | 1500 | 2.5 |
| Inventive Product 8 | Second Layer | 0.20 | 1000 | 0.50 | 1500 | 2.5 |

TABLE 1-continued

| | | Coating Layer | | | | |
| | | First Layer: $Ti(C_{x1}N_{1-x1})$ | | Second Layer: $(Ti_{1-y1}Al_{y1})N$ | | Total |
| | Undermost Layer | Elemental C Atomic Ratio x1 | Average Thickness (nm) | Elemental Al Atomic Ratio y1 | Average Thickness (nm) | Thickness (μm) |
|---|---|---|---|---|---|---|
| Inventive Product 9 | Second Layer | 0.20 | 1000 | 0.50 | 1500 | 2.5 |
| Inventive Product 10 | Second Layer | 0.30 | 1000 | 0.50 | 1500 | 2.5 |
| Inventive Product 11 | First Layer | 0.20 | 1000 | 0.50 | 1500 | 2.5 |
| Inventive Product 12 | Second Layer | 0.20 | 1000 | 0.50 | 1500 | 2.5 |
| Inventive Product 13 | Second Layer | 0.20 | 1000 | 0.50 | 1500 | 2.5 |
| Inventive Product 14 | Second Layer | 0.20 | 1000 | 0.50 | 1500 | 2.5 |

TABLE 2

| | | Coating Layer | | | | |
| | | Layer A: $Ti(C_{x1}N_{1-x1})$ | | Layer B: $(Ti_{1-y1}Al_{y1})N$ | | Total |
| | Undermost Layer | Elemental C Atomic Ratio x1 | Average Thickness (nm) | Elemental Al Atomic Ratio y1 | Average Thickness (nm) | Thickness (μm) |
|---|---|---|---|---|---|---|
| Comparative Product 1 | Layer B | 0.00 | 1000 | 0.50 | 1500 | 2.5 |
| Comparative Product 2 | Layer B | 0.35 | 1000 | 0.50 | 1500 | 2.5 |
| Comparative Product 3 | Layer B | 0.20 | 1000 | 0.20 | 1500 | 2.5 |
| Comparative Product 4 | Layer B | 0.20 | 1000 | 0.80 | 1500 | 2.5 |
| Comparative Product 5 | Layer A | 0.20 | 500 | 0.50 | 2500 | 3.0 |
| Comparative Product 6 | Layer B | 0.20 | 1500 | 0.50 | 1000 | 2.5 |
| Comparative Product 7 | Layer B | 0.20 | 1000 | 0.50 | 1500 | 2.5 |
| Comparative Product 8 | Layer B | 0.20 | 1000 | 0.50 | 1500 | 2.5 |
| Comparative Product 9 | Layer A | 0.20 | 1000 | 0.50 | 1500 | 2.5 |
| Comparative Product 10 | Layer B | 0.20 | 1000 | 0.50 | 1500 | 2.5 |
| Comparative Product 11 | Layer B | 0.20 | 1000 | 0.50 | 1500 | 2.5 |

TABLE 3

| | First Layer | | | | Second Layer | | | |
| | Temperature (° C.) | Pressure (Pa) | Voltage (V) | Current (A) | Temperature (° C.) | Pressure (Pa) | Voltage (V) | Current (A) |
|---|---|---|---|---|---|---|---|---|
| Inventive Product 1 | 450 | 1.0 | −60 | 120 | 450 | 1.0 | −60 | 120 |
| Inventive Product 2 | 450 | 5.0 | −60 | 120 | 450 | 5.0 | −60 | 120 |
| Inventive Product 3 | 450 | 3.0 | −60 | 120 | 450 | 3.0 | −60 | 120 |
| Inventive Product 4 | 450 | 3.0 | −60 | 120 | 450 | 3.0 | −60 | 120 |
| Inventive Product 5 | 450 | 3.0 | −60 | 120 | 450 | 3.0 | −60 | 120 |
| Inventive Product 6 | 450 | 3.0 | −60 | 120 | 450 | 3.0 | −60 | 120 |
| Inventive Product 7 | 550 | 3.0 | −40 | 120 | 450 | 3.0 | −60 | 120 |
| Inventive Product 8 | 350 | 3.0 | −80 | 120 | 450 | 3.0 | −60 | 120 |
| Inventive Product 9 | 450 | 3.0 | −35 | 120 | 450 | 3.0 | −60 | 120 |
| Inventive Product 10 | 500 | 5.0 | −80 | 120 | 450 | 5.0 | −60 | 120 |
| Inventive Product 11 | 450 | 3.0 | −60 | 120 | 350 | 3.0 | −60 | 120 |
| Inventive Product 12 | 450 | 3.0 | −60 | 120 | 550 | 3.0 | −50 | 120 |
| Inventive Product 13 | 450 | 3.0 | −60 | 120 | 400 | 3.0 | −40 | 120 |
| Inventive Product 14 | 450 | 3.0 | −60 | 120 | 550 | 3.0 | −100 | 120 |

TABLE 4

| | Layer A | | | | Layer B | | | |
| | Temperature (° C.) | Pressure (Pa) | Voltage (V) | Current (A) | Temperature (° C.) | Pressure (Pa) | Voltage (V) | Current (A) |
|---|---|---|---|---|---|---|---|---|
| Comparative Product 1 | 450 | 3.0 | −60 | 120 | 450 | 3.0 | −60 | 120 |
| Comparative Product 2 | 450 | 5.5 | −60 | 120 | 450 | 5.5 | −60 | 120 |
| Comparative Product 3 | 450 | 3.0 | −60 | 120 | 450 | 3.0 | −60 | 120 |
| Comparative Product 4 | 450 | 3.0 | −60 | 120 | 450 | 3.0 | −60 | 120 |
| Comparative Product 5 | 450 | 3.0 | −60 | 120 | 450 | 3.0 | −60 | 120 |
| Comparative Product 6 | 450 | 3.0 | −60 | 120 | 450 | 3.0 | −60 | 120 |
| Comparative Product 7 | 600 | 3.0 | −40 | 120 | 450 | 3.0 | −60 | 120 |
| Comparative Product 8 | 450 | 3.0 | −35 | 120 | 450 | 3.0 | −60 | 120 |
| Comparative Product 9 | 450 | 3.0 | −60 | 120 | 300 | 3.0 | −60 | 120 |

TABLE 4-continued

| | Layer A | | | | Layer B | | | |
|---|---|---|---|---|---|---|---|---|
| | Temperature (° C.) | Pressure (Pa) | Voltage (V) | Current (A) | Temperature (° C.) | Pressure (Pa) | Voltage (V) | Current (A) |
| Comparative Product 10 | 450 | 3.0 | −60 | 120 | 350 | 3.0 | −20 | 120 |
| Comparative Product 11 | 450 | 3.0 | −60 | 120 | 600 | 3.0 | −120 | 120 |

The average thickness of each layer of the obtained sample was determined by measuring the thicknesses of each layer by TEM observation of its cross-sections in three points near a position 50 μm from the cutting edge line part of the surface of the coated cutting tool facing the metal evaporation source toward the center of such a surface, and calculating the average (arithmetic mean). The results are also shown in Table 1 and Table 2.

The composition of each layer of the obtained sample was measured using EDS attached to TEM in a cross-section near a position up to 50 μm from the cutting edge line part of the surface of the coated cutting tool facing the metal evaporation source toward the center. In addition, the overall average composition of the compound layers in the first layer and the second layer was determined using TEM attached to commercially available EDS. Specifically, a cross-section of the coating layer (same as in the measurement of the thickness of the coating layer) was prepared, and the laminate structure of the first layer and the second layer was subjected to sectional analysis. At this time, the measurement range was "a length that is 90% of the thickness of the laminate structure of the first layer and the second layer"×"1 μm (length in the direction parallel to the substrate surface) or more". From the results of the sectional analysis, the atomic ratios in the overall average composition $(Ti_{1-y2}Al_{y2})(C_{x2}N_{1-x2})$ of the compound layers in the first layer and the second layer were each determined. The results are also shown in Table 1, Table 2, Table 5, and Table 6. Incidentally, in Table 1, Table 2, Table 5, and Table 6, the composition ratio of a metal element in each layer shows the atomic ratio of each metal element to all the metal elements in the metal compound constituting each layer.

TABLE 5

| | Coating Layer | | | |
|---|---|---|---|---|
| | Average Composition: $(Ti_{1-y2}Al_{y2})(C_{x2}N_{1-x2})$ | | | |
| | Elemental C Atomic Ratio x2 | Elemental Al Atomic Ratio y2 | ΔC | ΔAl |
| Inventive Product 1 | 0.02 | 0.30 | 0.02 | 0.20 |
| Inventive Product 2 | 0.12 | 0.30 | 0.18 | 0.20 |
| Inventive Product 3 | 0.08 | 0.30 | 0.12 | 0.20 |
| Inventive Product 4 | 0.08 | 0.16 | 0.12 | 0.11 |
| Inventive Product 5 | 0.08 | 0.44 | 0.12 | 0.30 |
| Inventive Product 6 | 0.04 | 0.40 | 0.16 | 0.10 |
| Inventive Product 7 | 0.08 | 0.30 | 0.12 | 0.20 |
| Inventive Product 8 | 0.08 | 0.30 | 0.12 | 0.20 |
| Inventive Product 9 | 0.08 | 0.30 | 0.12 | 0.20 |
| Inventive Product 10 | 0.12 | 0.30 | 0.18 | 0.20 |
| Inventive Product 11 | 0.08 | 0.30 | 0.12 | 0.20 |
| Inventive Product 12 | 0.08 | 0.30 | 0.12 | 0.20 |
| Inventive Product 13 | 0.08 | 0.30 | 0.12 | 0.20 |
| Inventive Product 14 | 0.08 | 0.30 | 0.12 | 0.20 |

TABLE 6

| | Coating Layer | | | |
|---|---|---|---|---|
| | Average Composition: $(Ti_{1-y2}Al_{y2})(C_{x2}N_{1-x2})$ | | | |
| | Elemental C Atomic Ratio x2 | Elemental Al Atomic Ratio y2 | ΔC | ΔAl |
| Comparative Product 1 | 0.00 | 0.30 | 0.00 | 0.20 |
| Comparative Product 2 | 0.14 | 0.30 | 0.21 | 0.20 |
| Comparative Product 3 | 0.08 | 0.12 | 0.12 | 0.08 |
| Comparative Product 4 | 0.08 | 0.48 | 0.12 | 0.32 |
| Comparative Product 5 | 0.03 | 0.42 | 0.17 | 0.08 |
| Comparative Product 6 | 0.12 | 0.20 | 0.08 | 0.30 |
| Comparative Product 7 | 0.08 | 0.30 | 0.12 | 0.20 |
| Comparative Product 8 | 0.08 | 0.30 | 0.12 | 0.20 |
| Comparative Product 9 | 0.08 | 0.30 | 0.12 | 0.20 |
| Comparative Product 10 | 0.08 | 0.30 | 0.12 | 0.20 |
| Comparative Product 11 | 0.08 | 0.30 | 0.12 | 0.20 |

[I(111)/I(200)]

The ratio I(111)/I(200) in each layer of the obtained sample was measured using an X-ray diffractometer Model: RINT TTRIII manufactured by Rigaku Corporation. Specifically, the peak intensity I(200) of the (200) plane of each layer and the peak intensity I(111) of the (111) plane of each layer were measured by X-ray diffraction measurement of the 2θ/θ focusing optical system with Cu-Kα radiation under the following conditions to calculate the ratio I(111)/I(200): output: 50 kV, 250 mA, incident-side Soller slit: 5°, divergence longitudinal slit: 2/3°, divergence longitudinal limiting slit: 5 mm, scattering slit: 2/3°, receiving-side Soller slit: 5°, receiving slit: 0.3 mm, BENT monochromator, receiving monochrome slit: 0.8 mm, sampling width: 0.01°, scanning speed: 4°/min, 2θ measurement range: 20 to 50°. The results are shown in Table 7 and Table 8.

[Residual Stress]

With respect to each obtained sample, the residual stress in each layer was measured by a sinew method using an X-ray diffractometer. As the residual stress, the stresses in arbitrary three points contained in a site involved in cutting were measured, and the average (arithmetic mean) was defined as the residual stress in each layer. The results are shown in Table 7 and Table 8.

[Average Particle Size]

With respect to each obtained sample, as described below, the average particle size of particles in each layer was measured using a commercially available transmission microscope (TEM). First, using a focused ion beam (FIB) processor, a thin-film sample was prepared, whose observation plane was a cross-section of a coating layer (a cross-section in the same direction as in the observation of the thickness of the coating layer: direction perpendicular to the substrate surface). The observation plane of the prepared sample was photographed as a scanning transmission electron image (STEM image). On the taken photograph, a straight line was drawn in the direction parallel to the surface of the substrate, and the number of particles constituting each layer was measured. The length of the straight line was divided by the number of particles, and the obtained value was defined as the average particle size. At this time, the length of the straight line was 10 μm or more. The measurement results are shown in Table 7 and Table 8.

TABLE 7

| | First Layer | | | | Second Layer | | | |
|---|---|---|---|---|---|---|---|---|
| | XRD Highest Peak Crystal Plane | I(111)/ I(200) | Average Particle Size (nm) | Residual Stress (GPa) | XRD Highest Peak Crystal Plane | I(111)/ I(200) | Average Particle Size (nm) | Residual Stress (GPa) |
| Inventive Product 1  | (111) | 6.5  | 76 | −3.1 | (200) | 0.4 | 180 | −1.2 |
| Inventive Product 2  | (111) | 6.2  | 38 | −3.8 | (200) | 0.5 | 174 | −0.8 |
| Inventive Product 3  | (111) | 6.7  | 60 | −3.5 | (200) | 0.4 | 182 | −0.8 |
| Inventive Product 4  | (111) | 6.3  | 64 | −3.5 | (200) | 0.6 | 186 | −1.0 |
| Inventive Product 5  | (111) | 6.0  | 56 | −3.5 | (200) | 0.5 | 175 | −1.8 |
| Inventive Product 6  | (111) | 6.7  | 62 | −2.8 | (200) | 0.5 | 178 | −1.0 |
| Inventive Product 7  | (111) | 1.3  | 80 | −2.5 | (200) | 0.6 | 180 | −0.8 |
| Inventive Product 8  | (111) | 19.0 | 32 | −4.0 | (200) | 0.4 | 176 | −1.2 |
| Inventive Product 9  | (111) | 5.8  | 95 | −2.2 | (200) | 0.5 | 174 | −0.8 |
| Inventive Product 10 | (111) | 7.2  | 10 | −4.0 | (200) | 0.6 | 178 | −1.0 |
| Inventive Product 11 | (111) | 6.5  | 60 | −3.4 | (200) | 0.9 | 175 | −0.8 |
| Inventive Product 12 | (111) | 6.6  | 60 | −3.2 | (200) | 0.1 | 204 | −1.0 |
| Inventive Product 13 | (111) | 6.5  | 64 | −3.2 | (200) | 0.6 | 296 | −0.2 |
| Inventive Product 14 | (111) | 6.3  | 62 | −3.4 | (200) | 0.7 | 105 | −2.0 |

TABLE 8

| | Layer A | | | | Layer B | | | |
|---|---|---|---|---|---|---|---|---|
| | XRD Highest Peak Crystal Plane | I(111)/ I(200) | Average Particle Size (nm) | Residual Stress (GPa) | XRD Highest Peak Crystal Plane | I(111)/ I(200) | Average Particle Size (nm) | Residual Stress (GPa) |
| Comparative Product 1  | (111) | 6.4 | 110 | −1.8 | (200) | 0.5 | 172 | −1.4 |
| Comparative Product 2  | (111) | 6.2 | 25  | −4.1 | (200) | 0.5 | 180 | −1.0 |
| Comparative Product 3  | (111) | 6.2 | 60  | −3.2 | (200) | 0.4 | 224 | −0.8 |
| Comparative Product 4  | (111) | 6.3 | 58  | −3.4 | (200) | 0.6 | 86  | −2.1 |
| Comparative Product 5  | (111) | 6.5 | 62  | −2.7 | (200) | 0.6 | 182 | −1.0 |
| Comparative Product 6  | (111) | 6.5 | 65  | −3.8 | (200) | 0.4 | 176 | −0.8 |
| Comparative Product 7  | (200) | 0.6 | 80  | −2.6 | (200) | 0.5 | 176 | −1.2 |
| Comparative Product 8  | (111) | 5.8 | 124 | −2.1 | (200) | 0.5 | 174 | −0.8 |
| Comparative Product 9  | (111) | 6.5 | 60  | −3.4 | (111) | 1.5 | 185 | −0.8 |
| Comparative Product 10 | (111) | 6.2 | 60  | −3.5 | (200) | 0.6 | 344 | 0.0  |
| Comparative Product 11 | (111) | 6.4 | 66  | −3.3 | (200) | 0.7 | 75  | −2.4 |

The obtained samples were subjected to the following cutting test and evaluated.

[Cutting Test 1]
Work material: SUS304
Work material shape: Round bar, 120 mm×400 mm
Cutting speed: 120 m/min
Feed per tooth: 0.3 mm/rev
Depth of cut: 2.0 mm
Coolant: Used Evaluation Criteria: The point of time when the sample was fractured (fracture occurred in the cutting edge part of the sample) or the width of flank wear reached 0.30 mm was defined as the tool life, and the processing time until the tool life was measured. In addition, the damage morphology with a processing time of 10 minutes was observed under SEM. Incidentally, when the damage morphology with a processing time of 10 minutes was "chipping", this means that the sample was chipped to such an extent that it was possible to continue the processing. In addition, a long processing time means excellent fracture resistance and wear resistance. The obtained evaluation results are shown in Table 9 and Table 10.

TABLE 9

| | Cutting Test 1 | |
|---|---|---|
| | Damage Morphology with Processing Time of 10 Minutes | Processing Time (min) |
| Inventive Product 1  | Normal wear | 22 |
| Inventive Product 2  | Normal wear | 35 |
| Inventive Product 3  | Normal wear | 30 |
| Inventive Product 4  | Normal wear | 31 |
| Inventive Product 5  | Normal wear | 25 |
| Inventive Product 6  | Normal wear | 26 |
| Inventive Product 7  | Normal wear | 29 |
| Inventive Product 8  | Normal wear | 32 |
| Inventive Product 9  | Normal wear | 29 |
| Inventive Product 10 | Normal wear | 31 |
| Inventive Product 11 | Normal wear | 28 |
| Inventive Product 12 | Normal wear | 31 |
| Inventive Product 13 | Normal wear | 35 |
| Inventive Product 14 | Normal wear | 29 |

TABLE 10

|  | Cutting Test 1 | |
| --- | --- | --- |
|  | Damage Morphology with Processing Time of 10 Minutes | Processing Time (min) |
| Comparative Product 1 | Normal wear | 12 |
| Comparative Product 2 | Chipping | 14 |
| Comparative Product 3 | Normal wear | 11 |
| Comparative Product 4 | Normal wear | 17 |
| Comparative Product 5 | Chipping | 13 |
| Comparative Product 6 | Chipping | 16 |
| Comparative Product 7 | Normal wear | 13 |
| Comparative Product 8 | Chipping | 16 |
| Comparative Product 9 | Chipping | 12 |
| Comparative Product 10 | Chipping | 13 |
| Comparative Product 11 | Chipping | 11 |

From the results shown in Table 9 and Table 10, the processing times of the inventive products were 22 minutes or more, which were longer than the processing times of all the comparative products.

From the above results, it turned out that as a result of improving the wear resistance and fracture resistance, the inventive products each had a prolonged tool life.

Example 2

As a substrate, an insert of CNMG120408-SM (cemented carbide having a composition 89.6WC-9.8Co-0.6$Cr_3C_2$ (all mass %)) was prepared. In the reaction vessel of an arc ion plating apparatus, a TiC evaporation source and a metal evaporation source were disposed to make the composition of each layer shown in Table 11 and Table 12. The prepared substrate was fixed to the fixing bracket of the turntable in the reaction vessel.

Subsequently, the inside of the reaction vessel was evacuated until the pressure reached a vacuum of $5.0 \times 10^{-3}$ Pa or less. After evacuation, using a heater in the reaction vessel, the substrate was heated until its temperature reached 450° C. After heating, Ar gas was introduced into the reaction vessel to make the pressure 2.7 Pa.

In an Ar gas atmosphere having a pressure of 2.7 Pa, a bias voltage of −400 V was applied to the substrate, and a current of 40 A was passed through the tungsten filament in the reaction vessel to subject the surface of the substrate to an ion bombardment treatment with Ar gas for 30 minutes. After the completion of the ion bombardment treatment, the inside of the reaction vessel was evacuated until the pressure reached a vacuum of $5.0 \times 10^{-3}$ Pa or less.

With respect to inventive products 15 to 31, after evacuation, the substrate was controlled so that its temperature was the temperature shown in Table 13 (temperature at the start of film formation), then a nitrogen gas ($N_2$) was introduced into the reaction vessel, and the pressure inside the reaction vessel was adjusted to the pressure shown in Table 13. Subsequently, the bias voltage shown in Table 13 was applied to the substrate, and the TiC evaporation source for a first layer having the composition shown in Table 11 and the metal evaporation source for a second layer having the composition shown in Table 11 were alternately evaporated through arc discharge at the arc current shown in Table 13 in such an order that the undermost layer shown in Table 11 was first formed on the surface of the substrate, thereby alternately forming a first layer and a second layer in such an order that the undermost layer shown in Table 11 served as the first surface of the substrate. At this time, the pressure inside the reaction vessel was controlled to be the pressure shown in Table 13. In addition, the thickness of the first layer and the thickness of the second layer were controlled to be the thicknesses shown in Table 11 by adjusting each arc discharge time.

With respect to comparative products 12 to 21, after evacuation, the substrate was controlled so that its temperature was the temperature shown in Table 14 (temperature at the start of film formation), then a nitrogen gas ($N_2$) was introduced into the reaction vessel, and the pressure inside the reaction vessel was adjusted to the pressure shown in Table 14. Subsequently, the bias voltage shown in Table 14 was applied to the substrate, and the TiC evaporation source for a first A having the composition shown in Table 12 and the metal evaporation source for a layer B having the composition shown in Table 12 were alternately evaporated through arc discharge at the arc current shown in Table 14 in such an order that the undermost layer shown in Table 12 was first formed on the surface of the substrate, thereby alternately forming a layer A and a layer B in such an order that the undermost layer shown in Table 12 served as the first surface of the substrate. At this time, the pressure inside the reaction vessel was controlled to be the pressure shown in Table 14. In addition, the thickness of the layer A and the thickness of the layer B were controlled to be the thicknesses shown in Table 12 by adjusting each arc discharge time.

After each layer was formed on the surface of the substrate to the predetermined average thickness shown in Table 11 or Table 12, the heater was turned off. After the sample temperature became 100° C. or less, the sample was removed from the inside of the reaction vessel.

TABLE 11

| | | Coating Layer | | | | | |
| --- | --- | --- | --- | --- | --- | --- | --- |
| | | First Layer: Ti($C_{x1}N_{1-x1}$) | | Second Layer: ($Ti_{1-y1}Al_{y1}$)N | | Number of | Total |
| | Undermost Layer | Elemental C Atomic Ratio x1 | Average Thickness (nm) | Elemental Al Atomic Ratio y1 | Average Thickness (nm) | Repeats (times) | Thickness (μm) |
| Inventive Product 15 | Second Layer | 0.04 | 100 | 0.50 | 100 | 20 | 4.0 |
| Inventive Product 16 | Second Layer | 0.30 | 100 | 0.50 | 100 | 20 | 4.0 |
| Inventive Product 17 | Second Layer | 0.20 | 100 | 0.50 | 100 | 20 | 4.0 |
| Inventive Product 18 | Second Layer | 0.20 | 100 | 0.27 | 100 | 20 | 4.0 |
| Inventive Product 18 | First Layer | 0.20 | 100 | 0.35 | 100 | 20 | 4.0 |
| Inventive Product 19 | Second Layer | 0.20 | 100 | 0.74 | 100 | 20 | 4.0 |
| Inventive Product 20 | Second Layer | 0.20 | 150 | 0.50 | 150 | 13 | 3.9 |
| Inventive Product 21 | Second Layer | 0.20 | 50 | 0.50 | 50 | 40 | 4.0 |
| Inventive Product 22 | Second Layer | 0.20 | 300 | 0.50 | 300 | 6 | 3.6 |
| Inventive Product 23 | Second Layer | 0.20 | 100 | 0.50 | 100 | 47 | 9.4 |
| Inventive Product 24 | Second Layer | 0.20 | 100 | 0.50 | 100 | 30 | 6.0 |
| Inventive Product 25 | Second Layer | 0.15 | 100 | 0.65 | 100 | 20 | 4.0 |

TABLE 11-continued

| | | Coating Layer | | | | | |
|---|---|---|---|---|---|---|---|
| | | First Layer: Ti($C_{x1}N_{1-x1}$) | | Second Layer: ($Ti_{1-y1}Al_{y1}$)N | | Number of | Total |
| | Undermost Layer | Elemental C Atomic Ratio x1 | Average Thickness (nm) | Elemental Al Atomic Ratio y1 | Average Thickness (nm) | Repeats (times) | Thickness (μm) |
| Inventive Product 26 | Second Layer | 0.15 | 100 | 0.65 | 100 | 20 | 4.0 |
| Inventive Product 27 | Second Layer | 0.15 | 100 | 0.65 | 100 | 20 | 4.0 |
| Inventive Product 28 | Second Layer | 0.30 | 100 | 0.65 | 100 | 20 | 4.0 |
| Inventive Product 29 | First Layer | 0.15 | 90 | 0.65 | 90 | 22 | 4.0 |
| Inventive Product 30 | Second Layer | 0.15 | 90 | 0.65 | 90 | 22 | 4.0 |
| Inventive Product 31 | Second Layer | 0.15 | 100 | 0.65 | 100 | 20 | 4.0 |

TABLE 12

| | | Coating Layer | | | | | |
|---|---|---|---|---|---|---|---|
| | | Layer A: Ti($C_{x1}N_{1-x1}$) | | Layer B: ($Ti_{1-y1}Al_{y1}$)N | | Number of | Total |
| | Undermost Layer | Elemental C Atomic Ratio x1 | Average Thickness (nm) | Elemental Al Atomic Ratio y1 | Average Thickness (nm) | Repeats (times) | Thickness (μm) |
| Comparative Product 12 | Layer B | 0.00 | 100 | 0.50 | 100 | 20 | 4.0 |
| Comparative Product 13 | Layer B | 0.35 | 100 | 0.50 | 100 | 20 | 4.0 |
| Comparative Product 14 | Layer A | 0.20 | 100 | 0.20 | 100 | 20 | 4.0 |
| Comparative Product 15 | Layer B | 0.20 | 100 | 0.80 | 100 | 20 | 4.0 |
| Comparative Product 16 | Layer B | 0.20 | 50 | 0.50 | 2500 | 2 | 5.1 |
| Comparative Product 17 | Layer B | 0.20 | 1500 | 0.50 | 100 | 4 | 6.4 |
| Comparative Product 18 | Layer B | 0.15 | 100 | 0.65 | 100 | 20 | 4.0 |
| Comparative Product 19 | Layer B | 0.15 | 100 | 0.65 | 100 | 20 | 4.0 |
| Comparative Product 20 | Layer A | 0.15 | 100 | 0.65 | 100 | 20 | 4.0 |
| Comparative Product 21 | Layer B | 0.15 | 100 | 0.65 | 100 | 20 | 4.0 |

TABLE 13

| | First Layer | | | | Second Layer | | | |
|---|---|---|---|---|---|---|---|---|
| | Temperature (° C.) | Pressure (Pa) | Voltage (V) | Current (A) | Temperature (° C.) | Pressure (Pa) | Voltage (V) | Current (A) |
| Inventive Product 15 | 450 | 1.0 | −60 | 120 | 450 | 1.0 | −60 | 120 |
| Inventive Product 16 | 450 | 5.0 | −60 | 120 | 450 | 5.0 | −60 | 120 |
| Inventive Product 17 | 450 | 3.0 | −60 | 120 | 450 | 3.0 | −60 | 120 |
| Inventive Product 18 | 450 | 3.0 | −60 | 120 | 450 | 3.0 | −60 | 120 |
| Inventive Product 18 | 450 | 3.0 | −60 | 120 | 450 | 3.0 | −60 | 120 |
| Inventive Product 19 | 450 | 3.0 | −60 | 120 | 450 | 3.0 | −60 | 120 |
| Inventive Product 20 | 450 | 3.0 | −60 | 120 | 450 | 3.0 | −60 | 120 |
| Inventive Product 21 | 450 | 3.0 | −60 | 120 | 450 | 3.0 | −60 | 120 |
| Inventive Product 22 | 450 | 3.0 | −60 | 120 | 450 | 3.0 | −60 | 120 |
| Inventive Product 23 | 450 | 3.0 | −60 | 120 | 450 | 3.0 | −60 | 120 |
| Inventive Product 24 | 450 | 3.0 | −60 | 120 | 450 | 3.0 | −60 | 120 |
| Inventive Product 25 | 550 | 2.4 | −40 | 120 | 450 | 2.4 | −60 | 120 |
| Inventive Product 26 | 350 | 2.4 | −80 | 120 | 450 | 2.4 | −60 | 120 |
| Inventive Product 27 | 450 | 2.4 | −35 | 120 | 450 | 2.4 | −60 | 120 |
| Inventive Product 28 | 500 | 5.0 | −80 | 120 | 450 | 5.0 | −60 | 120 |
| Inventive Product 29 | 450 | 2.4 | −60 | 120 | 350 | 2.4 | −60 | 120 |
| Inventive Product 30 | 450 | 2.4 | −60 | 120 | 550 | 2.4 | −50 | 120 |
| Inventive Product 31 | 450 | 2.4 | −60 | 120 | 550 | 2.4 | −100 | 120 |

TABLE 14

| | Layer A | | | | Layer B | | | |
|---|---|---|---|---|---|---|---|---|
| | Temperature (° C.) | Pressure (Pa) | Voltage (V) | Current (A) | Temperature (° C.) | Pressure (Pa) | Voltage (V) | Current (A) |
| Comparative Product 12 | 450 | 3.0 | −60 | 120 | 450 | 3.0 | −60 | 120 |
| Comparative Product 13 | 450 | 5.5 | −60 | 120 | 450 | 5.5 | −60 | 120 |
| Comparative Product 14 | 450 | 3.0 | −60 | 120 | 450 | 3.0 | −60 | 120 |
| Comparative Product 15 | 450 | 3.0 | −60 | 120 | 450 | 3.0 | −60 | 120 |
| Comparative Product 16 | 450 | 3.0 | −60 | 120 | 450 | 3.0 | −60 | 120 |
| Comparative Product 17 | 450 | 3.0 | −60 | 120 | 450 | 3.0 | −60 | 120 |

TABLE 14-continued

| | Layer A | | | | Layer B | | | |
|---|---|---|---|---|---|---|---|---|
| | Temperature (° C.) | Pressure (Pa) | Voltage (V) | Current (A) | Temperature (° C.) | Pressure (Pa) | Voltage (V) | Current (A) |
| Comparative Product 18 | 600 | 2.4 | −40 | 120 | 450 | 2.4 | −60 | 120 |
| Comparative Product 19 | 450 | 2.4 | −30 | 120 | 450 | 2.4 | −60 | 120 |
| Comparative Product 20 | 450 | 2.4 | −60 | 120 | 300 | 2.4 | −60 | 120 |
| Comparative Product 21 | 450 | 2.4 | −60 | 120 | 600 | 2.4 | −120 | 120 |

The average thickness of each layer of the obtained sample was determined by measuring the thicknesses of each layer by TEM observation of its cross-sections in three points near a position 50 μm from the cutting edge line part of the surface of the coated cutting tool facing the metal evaporation source toward the center of such a surface, and calculating the average (arithmetic mean). The average per-layer thickness of the first layer was calculated by dividing the total thickness, which is the total of the thicknesses t1 of layers of the first layer, by the number of layers of the first layer (the number of repeats). Similarly, the average per-layer thickness of the second layer was also calculated by dividing the total thickness, which is the total of the thicknesses t2 of layers of the second layer, by the number of layers of the second compound layer (the number of repeats). The results are also shown in Table 11 and Table 12.

The composition of each layer of the obtained sample was measured using EDS attached to TEM in a cross-section near a position up to 50 μm from the cutting edge line part of the surface of the coated cutting tool facing the metal evaporation source toward the center. In addition, the overall average composition of the compound layers in the first layer and the second layer was determined using TEM attached to commercially available EDS. Specifically, a cross-section of the coating layer (same as in the measurement of the thickness of the coating layer) was prepared, and the alternating laminate structure of the first layer and the second layer was subjected to sectional analysis. At this time, the measurement range was "a length that is 90% of the thickness of the alternating laminate structure of the first layer and the second layer"×"1 μm (length in the direction parallel to the substrate surface) or more". From the results of the sectional analysis, the atomic ratios in the overall average composition $(Ti_{1-y2}Al_{y2})(C_{x2}N_{1-x2})$ of the compound layers in the first layer and the second layer were each determined. The results are also shown in Table 11, Table 12, Table 15, and Table 16. Incidentally, in Table 11, Table 12, Table 15, and Table 16, the composition ratio of a metal element in each layer shows the atomic ratio of each metal element to all the metal elements in the metal compound constituting each layer.

TABLE 15

| | Coating Layer | | | |
|---|---|---|---|---|
| | Average Composition: $(Ti_{1-y2}Al_{y2})(C_{x2}N_{1-x2})$ | | | |
| | Elemental C Atomic Ratio x2 | Elemental Al Atomic Ratio y2 | ΔC | ΔAl |
| Inventive Product 15 | 0.02 | 0.25 | 0.02 | 0.25 |
| Inventive Product 16 | 0.15 | 0.25 | 0.15 | 0.25 |
| Inventive Product 17 | 0.10 | 0.25 | 0.10 | 0.25 |
| Inventive Product 18 | 0.10 | 0.14 | 0.10 | 0.14 |
| Inventive Product 18 | 0.10 | 0.18 | 0.10 | 0.18 |
| Inventive Product 19 | 0.10 | 0.37 | 0.10 | 0.37 |
| Inventive Product 20 | 0.10 | 0.25 | 0.10 | 0.25 |
| Inventive Product 21 | 0.10 | 0.25 | 0.10 | 0.25 |
| Inventive Product 22 | 0.10 | 0.25 | 0.10 | 0.25 |
| Inventive Product 23 | 0.10 | 0.25 | 0.10 | 0.25 |
| Inventive Product 24 | 0.10 | 0.25 | 0.10 | 0.25 |
| Inventive Product 25 | 0.08 | 0.33 | 0.08 | 0.33 |
| Inventive Product 26 | 0.08 | 0.33 | 0.08 | 0.33 |
| Inventive Product 27 | 0.08 | 0.33 | 0.08 | 0.33 |
| Inventive Product 28 | 0.15 | 0.33 | 0.15 | 0.33 |
| Inventive Product 29 | 0.08 | 0.33 | 0.08 | 0.33 |
| Inventive Product 30 | 0.08 | 0.33 | 0.08 | 0.33 |
| Inventive Product 31 | 0.08 | 0.33 | 0.08 | 0.33 |

TABLE 16

| | Coating Layer | | | |
|---|---|---|---|---|
| | Average Composition: $(Ti_{1-y2}Al_{y2})(C_{x2}N_{1-x2})$ | | | |
| | Elemental C Atomic Ratio x2 | Elemental Al Atomic Ratio y2 | ΔC | ΔAl |
| Comparative Product 12 | 0.00 | 0.25 | 0.00 | 0.25 |
| Comparative Product 13 | 0.18 | 0.25 | 0.18 | 0.25 |
| Comparative Product 14 | 0.10 | 0.10 | 0.10 | 0.10 |
| Comparative Product 15 | 0.10 | 0.40 | 0.10 | 0.40 |
| Comparative Product 16 | 0.00 | 0.49 | 0.20 | 0.01 |
| Comparative Product 17 | 0.19 | 0.03 | 0.01 | 0.47 |
| Comparative Product 18 | 0.08 | 0.33 | 0.08 | 0.33 |
| Comparative Product 19 | 0.08 | 0.33 | 0.08 | 0.33 |
| Comparative Product 20 | 0.08 | 0.33 | 0.08 | 0.33 |
| Comparative Product 21 | 0.08 | 0.33 | 0.08 | 0.33 |

[I(111)/I(200)]

The ratio I(111)/I(200) in each layer of the obtained sample was measured using an X-ray diffractometer Model: RINT TTRIII manufactured by Rigaku Corporation. Specifically, the peak intensity I(200) of the (200) plane of each layer and the peak intensity I(111) of the (111) plane of each layer were measured by X-ray diffraction measurement of the 2θ/θ focusing optical system with Cu-Kα radiation under the following conditions to calculate the ratio I(111)/I(200): output: 50 kV, 250 mA, incident-side Soller slit: 5°, divergence longitudinal slit: 2/3°, divergence longitudinal limiting slit: 5 mm, scattering slit: 2/3°, receiving-side Soller slit: 5°, receiving slit: 0.3 mm, BENT monochromator, receiving monochrome slit: 0.8 mm, sampling width: 0.01°, scanning speed: 4°/min, 2θ measurement range: 20 to 50°. The results are shown in Table 17 and Table 18.

[Residual Stress]

With respect to each obtained sample, the residual stress in each layer was measured by a sinew method using an X-ray diffractometer. As the residual stress, the stresses in arbitrary three points contained in a site involved in cutting were measured, and the average (arithmetic mean) was defined as the residual stress in each layer. The results are shown in Table 17 and Table 18.

[Average Particle Size]

With respect to each obtained sample, as described below, the average particle size of particles in each layer was measured using a commercially available transmission microscope (TEM). First, using a focused ion beam (FIB) processor, a thin-film sample was prepared, whose observation plane was a cross-section of a coating layer (a cross-section in the same direction as in the observation of the thickness of the coating layer: direction perpendicular to the substrate surface). The observation plane of the prepared sample was photographed as a scanning transmission electron image (STEM image). On the taken photograph, a straight line was drawn in the direction parallel to the surface of the substrate, and the number of particles constituting each layer was measured. The length of the straight line was divided by the number of particles, and the obtained value was defined as the average particle size. At this time, the length of the straight line was 10 μm or more. The measurement results are shown in Table 17 and Table 18.

TABLE 17

|  | First Layer | | | | Second Layer | | | |
|---|---|---|---|---|---|---|---|---|
|  | XRD Highest Peak Crystal Plane | I(111)/ I(200) | Average Particle Size (nm) | Residual Stress (GPa) | XRD Highest Peak Crystal Plane | I(111)/ I(200) | Average Particle Size (nm) | Residual Stress (GPa) |
| Inventive Product 15 | (111) | 6.4 | 72 | −2.9 | (200) | 0.5 | 121 | −1.2 |
| Inventive Product 16 | (111) | 6.1 | 42 | −3.6 | (200) | 0.6 | 117 | −1.0 |
| Inventive Product 17 | (111) | 6.6 | 58 | −3.4 | (200) | 0.4 | 123 | −1.2 |
| Inventive Product 18 | (111) | 6.2 | 64 | −3.3 | (200) | 0.6 | 122 | −1.0 |
| Inventive Product 18 | (111) | 6.1 | 60 | −3.1 | (200) | 0.4 | 126 | −0.8 |
| Inventive Product 19 | (111) | 6.2 | 60 | −3.3 | (200) | 0.5 | 118 | −1.5 |
| Inventive Product 20 | (111) | 6.7 | 65 | −3.5 | (200) | 0.5 | 173 | −1.2 |
| Inventive Product 21 | (111) | 6.4 | 60 | −2.8 | (200) | 0.6 | 105 | −1.2 |
| Inventive Product 22 | (111) | 7.0 | 68 | −3.2 | (200) | 0.5 | 184 | −1.0 |
| Inventive Product 23 | (111) | 6.8 | 60 | −3.8 | (200) | 0.4 | 124 | −1.2 |
| Inventive Product 24 | (111) | 6.6 | 60 | −3.6 | (200) | 0.6 | 122 | −1.0 |
| Inventive Product 25 | (111) | 1.2 | 84 | −2.5 | (200) | 0.6 | 123 | −0.8 |
| Inventive Product 26 | (111) | 19.4 | 28 | −3.8 | (200) | 0.4 | 120 | −1.2 |
| Inventive Product 27 | (111) | 5.5 | 92 | −2.2 | (200) | 0.4 | 118 | −0.8 |
| Inventive Product 28 | (111) | 7.4 | 12 | −3.8 | (200) | 0.6 | 121 | −1.1 |
| Inventive Product 29 | (111) | 6.3 | 58 | −3.1 | (200) | 0.8 | 112 | −1.0 |
| Inventive Product 30 | (111) | 6.2 | 64 | −3.0 | (200) | 0.1 | 119 | −0.8 |
| Inventive Product 31 | (111) | 6.4 | 58 | −3.2 | (200) | 0.7 | 105 | −2.0 |

TABLE 18

|  | Layer A | | | | Layer B | | | |
|---|---|---|---|---|---|---|---|---|
|  | XRD Highest Peak Crystal Plane | I(111)/ I(200) | Average Particle Size (nm) | Residual Stress (GPa) | XRD Highest Peak Crystal Plane | I(111)/ I(200) | Average Particle Size (nm) | Residual Stress (GPa) |
| Comparative Product 12 | (111) | 6.2 | 116 | −1.6 | (200) | 0.4 | 154 | −1.2 |
| Comparative Product 13 | (111) | 6.2 | 28 | −4.2 | (200) | 0.5 | 130 | −1.0 |
| Comparative Product 14 | (111) | 6.5 | 60 | −3.3 | (200) | 0.3 | 160 | −0.8 |
| Comparative Product 15 | (111) | 6.3 | 64 | −3.4 | (200) | 0.5 | 80 | −2.2 |
| Comparative Product 16 | (111) | 6.1 | 58 | −2.4 | (200) | 0.6 | 182 | −1.0 |
| Comparative Product 17 | (111) | 6.7 | 68 | −3.9 | (200) | 0.3 | 120 | −0.9 |
| Comparative Product 18 | (200) | 0.4 | 75 | −2.5 | (200) | 0.6 | 128 | −1.2 |
| Comparative Product 19 | (111) | 5.5 | 132 | −1.9 | (200) | 0.4 | 120 | −1.0 |
| Comparative Product 20 | (111) | 6.6 | 66 | −3.6 | (111) | 1.4 | 132 | −0.7 |
| Comparative Product 21 | (111) | 6.5 | 65 | −3.4 | (200) | 0.6 | 64 | −2.4 |

The obtained samples were subjected to the following cutting test and evaluated.

[Cutting Test 2]
Work material: SUS304
Work material shape: Round bar, 120 mm×400 mm
Cutting speed: 150 m/min
Feed per tooth: 0.3 mm/rev
Depth of cut: 2.0 mm
Coolant: Used Evaluation Criteria: The point of time when the sample was fractured (fracture occurred in the cutting edge part of the sample) or the width of flank wear reached 0.30 mm was defined as the tool life, and the processing time until the tool life was measured. In addition, the damage morphology with a processing time of 10 minutes was observed under SEM. Incidentally, when the damage morphology with a processing time of 10 minutes was "chipping", this means that the sample was chipped to such an extent that it was possible to continue the processing. In addition, a long processing time means excellent fracture resistance and wear resistance. The obtained evaluation results are shown in Table 19 and Table 20.

TABLE 19

| | Cutting Test 2 | |
|---|---|---|
| | Damage Morphology with Processing Time of 10 Minutes | Processing Time (min) |
| Inventive Product 15 | Normal wear | 18 |
| Inventive Product 16 | Normal wear | 29 |
| Inventive Product 17 | Normal wear | 25 |
| Inventive Product 18 | Normal wear | 27 |
| Inventive Product 18 | Normal wear | 26 |
| Inventive Product 19 | Normal wear | 24 |
| Inventive Product 20 | Normal wear | 27 |
| Inventive Product 21 | Normal wear | 25 |
| Inventive Product 22 | Normal wear | 29 |
| Inventive Product 23 | Normal wear | 38 |
| Inventive Product 24 | Normal wear | 33 |
| Inventive Product 25 | Normal wear | 24 |
| Inventive Product 26 | Normal wear | 27 |
| Inventive Product 27 | Normal wear | 24 |
| Inventive Product 28 | Normal wear | 26 |
| Inventive Product 29 | Normal wear | 23 |
| Inventive Product 30 | Normal wear | 26 |
| Inventive Product 31 | Normal wear | 24 |

TABLE 20

| | Cutting Test 2 | |
|---|---|---|
| | Damage Morphology with Processing Time of 10 Minutes | Processing Time (min) |
| Comparative Product 12 | Normal wear | 10 |
| Comparative Product 13 | Chipping | 12 |
| Comparative Product 14 | Chipped | 9 |
| Comparative Product 15 | Normal wear | 14 |
| Comparative Product 16 | Chipping | 11 |
| Comparative Product 17 | Chipping | 13 |
| Comparative Product 18 | Normal wear | 11 |
| Comparative Product 19 | Chipping | 13 |
| Comparative Product 20 | Chipped | 10 |
| Comparative Product 21 | Chipped | 9 |

From the results shown in Table 19 and Table 20, the processing times of the inventive products were 18 minutes or more, which were longer than the processing times of all the comparative products.

From the above results, it turned out that as a result of improving the wear resistance and fracture resistance, the inventive products each had a prolonged tool life.

INDUSTRIAL APPLICABILITY

The coated cutting tool of the invention has excellent wear resistance and fracture resistance, and thus the tool life can be made longer than before. In this respect, its industrial applicability is high.

REFERENCE SIGNS LIST

1: Substrate, 2: first layer, 3: second layer, 4: alternating laminate structure, 5: coating layer, 6: coated cutting tool.

What is claimed is:

1. A coated cutting tool comprising a substrate and a coating layer formed on the substrate,
the coated cutting tool being configured such that
the coating layer includes a first layer containing a compound having a composition represented by the following formula (1) and a second layer containing a compound having a composition represented by the following formula (2):

$$Ti(C_{x1}N_{1-x1}) \quad (1)$$

(in formula (1), x1 represents the atomic ratio of elemental C to the total of elemental C and elemental N and satisfies $0.02 \leq x1 \leq 0.30$)

$$(Ti_{1-y1}Al_{y1})N \quad (2)$$

(in formula (2), y1 represents the atomic ratio of elemental Al to the total of elemental Ti and elemental Al and satisfies $0.25 \leq y1 \leq 0.75$),
particles in the first layer have an average particle size of 5 nm or more and less than 100 nm,
in the first layer, the ratio of the diffraction peak intensity I(111) of the (111) plane to the diffraction peak intensity I(200) of the (200) plane is $1.0 \leq I(111)/I(200) \leq 20.0$,
the first layer has an average thickness of 5 nm or more and 1.0 μm or less,
in the second layer, the ratio of the diffraction peak intensity I(111) of the (111) plane to the diffraction peak intensity I(200) of the (200) plane is $0.1 \leq I(111)/I(200) \leq 1.0$,
particles in the second layer have an average particle size of more than 100 nm and 300 nm or less, and
the second layer has an average thickness of 5 nm or more and 2.0 μm or less.

2. The coated cutting tool according to claim 1, wherein the compounds in the first layer and the second layer have an overall average composition represented by the following formula (3):

$$(Ti_{1-y2}Al_{y2})(C_{x2}N_{1-x2}) \quad (3)$$

(in formula (3), x2 represents the atomic ratio of elemental C to the total of elemental C and elemental N and satisfies $0.01 \leq x2 \leq 0.15$, and y2 represents the atomic ratio of elemental Al to the total of elemental Ti and elemental Al and satisfies $0.12 \leq y2 \leq 0.38$).

3. The coated cutting tool according to claim 1, wherein the first layer has a residual stress of −4.0 GPa or more and −2.0 GPa or less, and the second layer has a residual stress of −2.0 GPa or more and 0 GPa or less.

4. The coated cutting tool according to claim 1, wherein the coating layer has an alternating laminate structure formed by alternately forming the first layer and the second layer repeatedly at least twice.

5. The coated cutting tool according to claim 1, wherein in the X-ray diffraction of the first layer, the (111) plane shows the highest peak.

6. The coated cutting tool according to claim 1, wherein in the X-ray diffraction of the second layer, the (200) plane shows the highest peak.

7. The coated cutting tool according to claim 2, wherein the difference ΔC (x1−x2) between the atomic ratio x2 of elemental C in the average composition represented by formula (3) and the atomic ratio x1 of elemental C in the composition represented by formula (1) is 0.01 or more and 0.15 or less.

8. The coated cutting tool according to claim 2, wherein the difference ΔAl (y1−y2) between the atomic ratio y2 of elemental Al in the average composition represented by formula (3) and the atomic ratio y1 of elemental Al in the composition represented by formula (2) is 0.12 or more and 0.38 or less.

9. The coated cutting tool according to claim 1, wherein the coating layer has an overall average thickness of 2.0 μm or more and 10.0 μm or less.

10. The coated cutting tool according to claim 1, wherein the substrate is a cemented carbide, a cermet, a ceramic, or a cubic boron nitride sintered compact.

11. The coated cutting tool according to claim 2, wherein the first layer has a residual stress of −4.0 GPa or more and −2.0 GPa or less, and the second layer has a residual stress of −2.0 GPa or more and 0 GPa or less.

12. The coated cutting tool according to claim 2, wherein the coating layer has an alternating laminate structure formed by alternately forming the first layer and the second layer repeatedly at least twice.

13. The coated cutting tool according to claim 3, wherein the coating layer has an alternating laminate structure formed by alternately forming the first layer and the second layer repeatedly at least twice.

14. The coated cutting tool according to claim 11, wherein the coating layer has an alternating laminate structure formed by alternately forming the first layer and the second layer repeatedly at least twice.

15. The coated cutting tool according to claim 2, wherein in the X-ray diffraction of the first layer, the (111) plane shows the highest peak.

16. The coated cutting tool according to claim 3, wherein in the X-ray diffraction of the first layer, the (111) plane shows the highest peak.

17. The coated cutting tool according to claim 4, wherein in the X-ray diffraction of the first layer, the (111) plane shows the highest peak.

18. The coated cutting tool according to claim 14, wherein in the X-ray diffraction of the first layer, the (111) plane shows the highest peak.

19. The coated cutting tool according to claim 2, wherein the coating layer has an overall average thickness of 2.0 μm or more and 10.0 μm or less.

20. The coated cutting tool according to claim 3, wherein the coating layer has an overall average thickness of 2.0 μm or more and 10.0 μm or less.

* * * * *